(12) United States Patent
Shiino et al.

(10) Patent No.: US 8,873,298 B2
(45) Date of Patent: Oct. 28, 2014

(54) NONVOLATILE SEMICONDUCTOR STORAGE DEVICE

(75) Inventors: Yasuhiro Shiino, Fujisawa (JP); Eietsu Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 386 days.

(21) Appl. No.: 13/451,843

(22) Filed: Apr. 20, 2012

(65) Prior Publication Data

US 2013/0077409 A1 Mar. 28, 2013

(30) Foreign Application Priority Data

Sep. 22, 2011 (JP) ................................. 2011-207850

(51) Int. Cl.
  *G11C 11/34* (2006.01)
  *G11C 11/56* (2006.01)
  *G11C 16/34* (2006.01)
  *G11C 16/04* (2006.01)

(52) U.S. Cl.
  CPC ........ *G11C 11/5628* (2013.01); *G11C 16/3459* (2013.01); *G11C 2211/5644* (2013.01); *G11C 2211/5621* (2013.01); *G11C 16/0483* (2013.01)
  USPC ............ 365/185.22; 365/185.03; 365/185.18; 365/185.19

(58) Field of Classification Search
  USPC .............. 365/185.22, 185.03, 185.18, 185.19
  See application file for complete search history.

(56) References Cited

U.S. PATENT DOCUMENTS

| | | | |
|---|---|---|---|
| 6,288,935 B1 | 9/2001 | Shibata et al. | |
| 6,643,188 B2 | 11/2003 | Tanaka et al. | |
| 8,149,631 B2 | 4/2012 | Shiino et al. | |
| 2006/0221697 A1 | 10/2006 | Li et al. | |
| 2009/0016104 A1* | 1/2009 | Kim | 365/185.03 |
| 2011/0110154 A1* | 5/2011 | Kim et al. | 365/185.03 |

FOREIGN PATENT DOCUMENTS

| | | |
|---|---|---|
| JP | 2000-163976 | 6/2000 |
| JP | 2008-535138 A | 8/2008 |
| JP | 2009-522707 | 6/2009 |
| WO | WO 2007/076512 A2 | 7/2007 |

OTHER PUBLICATIONS

Japanese Office Action issued Apr. 2, 2013 in Patent Application No. 2011-207850 with English Translation.

* cited by examiner

*Primary Examiner* — Han Yang
(74) *Attorney, Agent, or Firm* — Oblon, Spivak, McClelland, Maier & Neustadt, L.L.P.

(57) ABSTRACT

A nonvolatile semiconductor storage device according to an embodiment includes: a memory cell array including plural memory cells; and a control circuit that repeatedly performs a write loop including a program operation and a verify operation in data write performed to the memory cell, the verify operation including a preverify step to check whether a threshold voltage of the memory cell transitions to a preverify voltage, and a real verify step to check whether the threshold voltage of the memory cell transitions to the real verify voltage, the write loop including one or at least two verify operations corresponding to pieces of the data, the control circuit performing the write loop in which the preverify step of the verify operation corresponding to a first data is omitted after obtaining a first condition.

19 Claims, 27 Drawing Sheets

FIG. 10

COMPARATIVE EXAMPLE

| LW | A LEVEL | | B LEVEL | | C LEVEL | |
|---|---|---|---|---|---|---|
| | Va' | Va | Vb' | Vb | Vc' | Vc |
| 1 | Verify | Verify | Verify | Verify | Verify | Verify |
| 2 | Verify | Verify | Verify | Verify | Verify | Verify |
| 3 | Verify | Verify | Verify | Verify | Verify | Verify |
| 4 | Verify | Verify | Verify | Verify | Verify | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Verify | Verify | Verify | Verify | Verify | Verify |
| 9 | Verify | Verify | Verify | Verify | Verify | Verify |
| 10 | Verify | Verify | Verify | Verify | Verify | Verify |
| 11 | | | Verify | Verify | Verify | Verify |
| 12 | | | Verify | Verify | Verify | Verify |
| 13 | | | Verify | Verify | Verify | Verify |
| 14 | | | Verify | Verify | Verify | Verify |
| 15 | | | Verify | Verify | Verify | Verify |
| 16 | | | | | Verify | Verify |
| 17 | | | | | Verify | Verify |
| 18 | | | | | Verify | Verify |
| 19 | | | | | Verify | Verify |
| 20 | | | | | Verify | Verify |

EMBODIMENT

| LW | A LEVEL | | B LEVEL | | C LEVEL | |
|---|---|---|---|---|---|---|
| | Va' | Va | Vb' | Vb | Vc' | Vc |
| 1 | Verify | Verify | Verify | Verify | Verify | Verify |
| 2 | Verify | Verify | Verify | Verify | Verify | Verify |
| 3 | Verify | Verify | Verify | Verify | Verify | Verify |
| 4 | Verify | Verify | Verify | Verify | Verify | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Skip | Verify | Verify | Verify | Verify | Verify |
| 9 | Skip | Verify | Verify | Verify | Verify | Verify |
| 10 | Skip | Verify | Verify | Verify | Verify | Verify |
| 11 | | | Verify | Verify | Verify | Verify |
| 12 | | | Verify | Verify | Verify | Verify |
| 13 | | | Skip | Verify | Verify | Verify |
| 14 | | | Skip | Verify | Verify | Verify |
| 15 | | | Skip | Verify | Verify | Verify |
| 16 | | | | | Verify | Verify |
| 17 | | | | | Verify | Verify |
| 18 | | | | | Skip | Verify |
| 19 | | | | | Skip | Verify |
| 20 | | | | | Skip | Verify |

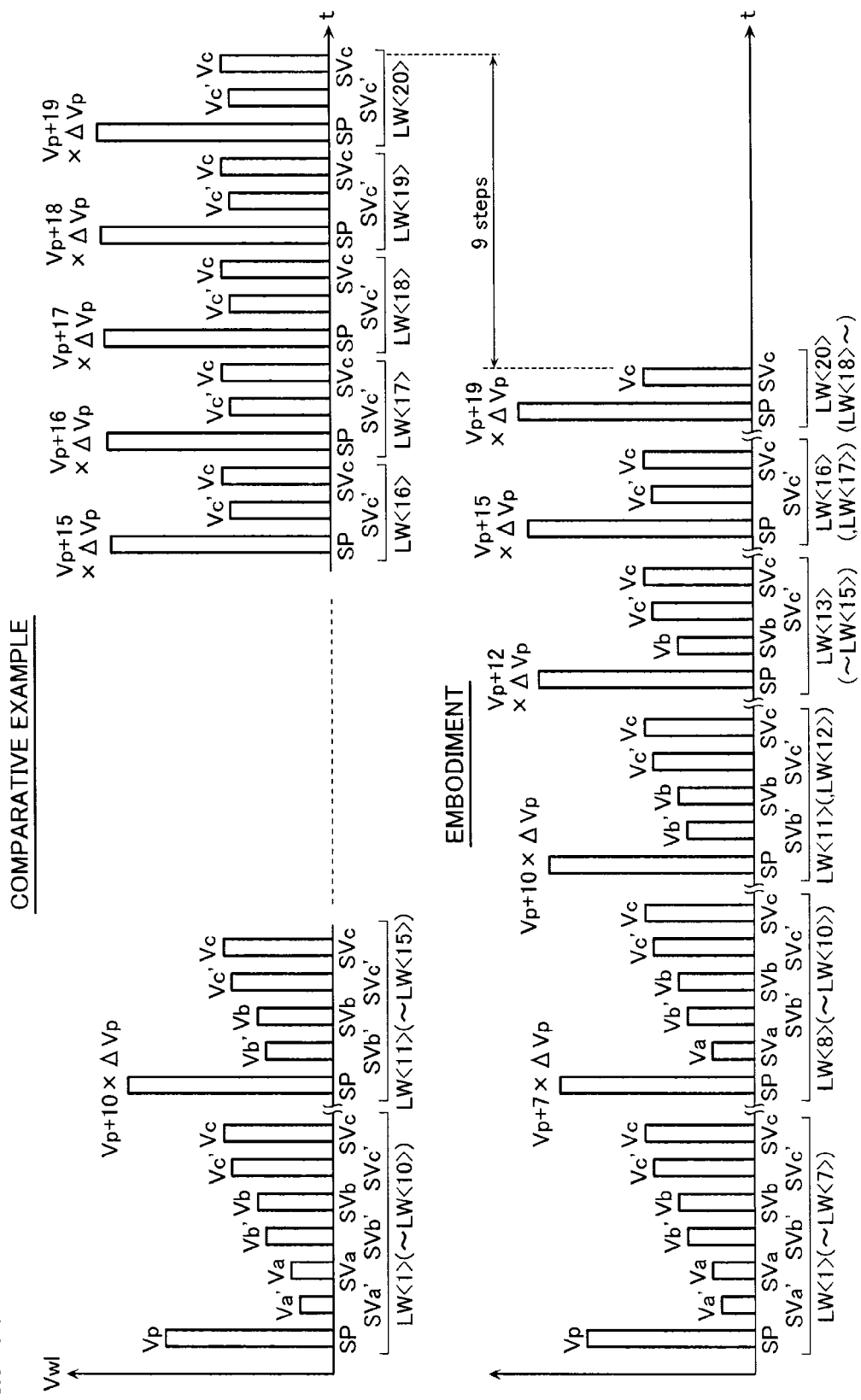

FIG. 13

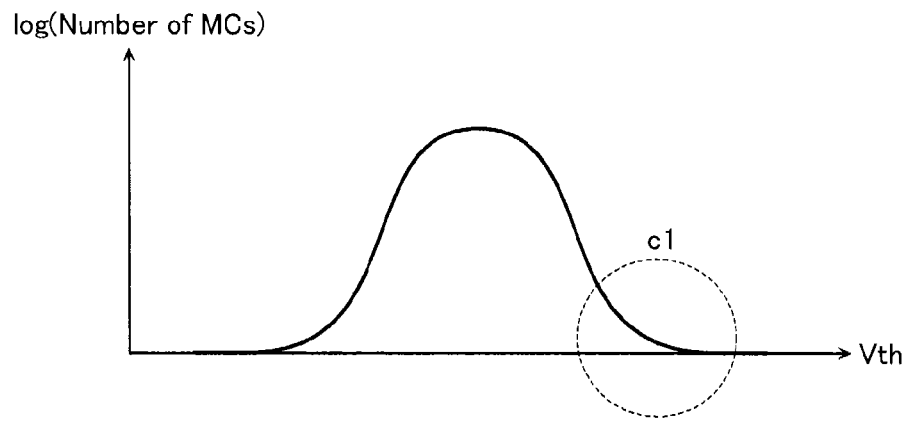

FIG. 15

| LW | A LEVEL | | B LEVEL | | C LEVEL | |
|---|---|---|---|---|---|---|
| | Va' | Va | Vb' | Vb | Vc' | Vc |
| 1 | Skip | Verify | Skip | Verify | Skip | Verify |
| 2 | Skip | Verify | Skip | Verify | Skip | Verify |
| 3 | Verify | Verify | Skip | Verify | Skip | Verify |
| 4 | Verify | Verify | Skip | Verify | Skip | Verify |
| 5 | Verify | Verify | Verify | Verify | Skip | Verify |
| 6 | Verify | Verify | Verify | Verify | Skip | Verify |
| 7 | Verify | Verify | Verify | Verify | Skip | Verify |
| 8 | Skip | Verify | Verify | Verify | Verify | Verify |
| 9 | Skip | Verify | Verify | Verify | Verify | Verify |
| 10 | Skip | Verify | Verify | Verify | Verify | Verify |
| 11 | | | Verify | Verify | Verify | Verify |
| 12 | | | Verify | Verify | Verify | Verify |
| 13 | | | Skip | Verify | Verify | Verify |
| 14 | | | Skip | Verify | Verify | Verify |
| 15 | | | Skip | Verify | Verify | Verify |
| 16 | | | | | Verify | Verify |
| 17 | | | | | Verify | Verify |
| 18 | | | | | Skip | Verify |
| 19 | | | | | Skip | Verify |
| 20 | | | | | Skip | Verify |

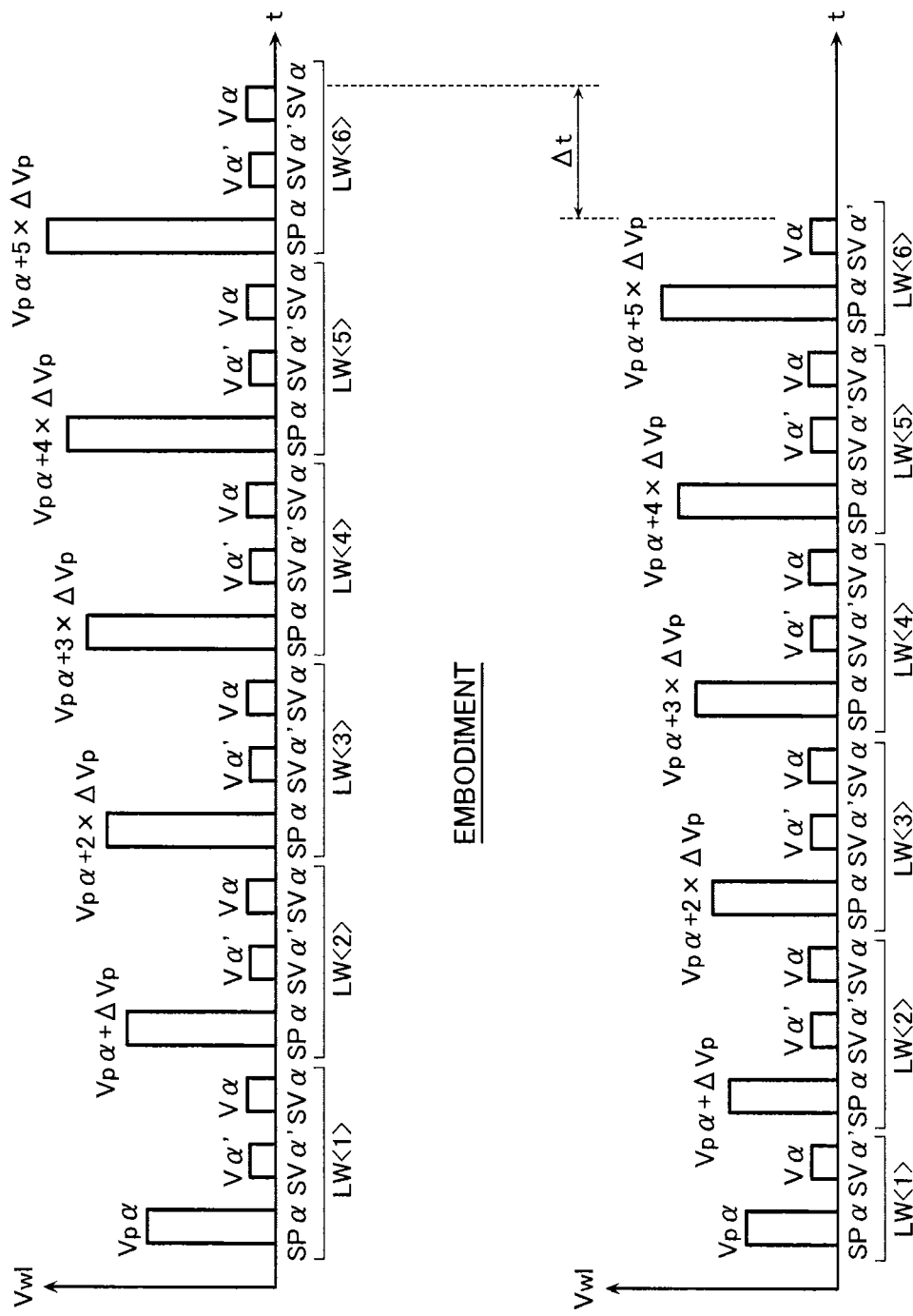

FIG. 19

| LW | A LEVEL | | B LEVEL | | C LEVEL | |
|---|---|---|---|---|---|---|
| | Va' | Va | Vb' | Vb | Vc' | Vc |
| 1 | Skip | Skip | Skip | Skip | Skip | Skip |
| 2 | Skip | Verify | Skip | Skip | Skip | Skip |
| 3 | Verify | Verify | Skip | Skip | Skip | Skip |
| 4 | Verify | Verify | Skip | Verify | Skip | Skip |
| 5 | Verify | Verify | Verify | Verify | Skip | Skip |
| 6 | Verify | Verify | Verify | Verify | Skip | Skip |
| 7 | Verify | Verify | Verify | Verify | Skip | Verify |
| 8 | Skip | Verify | Verify | Verify | Verify | Verify |
| 9 | Skip | Verify | Verify | Verify | Verify | Verify |
| 10 | Skip | Verify | Verify | Verify | Verify | Verify |
| 11 | | | Verify | Verify | Verify | Verify |
| 12 | | | Verify | Verify | Verify | Verify |
| 13 | | | Skip | Verify | Verify | Verify |
| 14 | | | Skip | Verify | Verify | Verify |
| 15 | | | Skip | Verify | Verify | Verify |
| 16 | | | | | Verify | Verify |
| 17 | | | | | Verify | Verify |
| 18 | | | | | Skip | Verify |
| 19 | | | | | Skip | Verify |
| 20 | | | | | Skip | Verify |

FIG. 21

| LW | A LEVEL | | B LEVEL | | C LEVEL | |
|---|---|---|---|---|---|---|
| | Va' | Va | Vb' | Vb | Vc' | Vc |
| 1 | Skip | Skip | Skip | Skip | Skip | Skip |
| 2 | Skip | Skip | Skip | Skip | Skip | Skip |
| 3 | Verify | Skip | Skip | Skip | Skip | Skip |
| 4 | Verify | Verify | Skip | Skip | Skip | Skip |
| 5 | Verify | Verify | Verify | Skip | Skip | Skip |
| 6 | Verify | Verify | Verify | Verify | Skip | Skip |
| 7 | Verify | Verify | Verify | Verify | Skip | Skip |
| 8 | Skip | Verify | Verify | Verify | Verify | Skip |
| 9 | Skip | Verify | Verify | Verify | Verify | Verify |
| 10 | Skip | Verify | Verify | Verify | Verify | Verify |
| 11 | | | Verify | Verify | Verify | Verify |
| 12 | | | Verify | Verify | Verify | Verify |
| 13 | | | Skip | Verify | Verify | Verify |
| 14 | | | Skip | Verify | Verify | Verify |
| 15 | | | Skip | Verify | Verify | Verify |
| 16 | | | | | Verify | Verify |
| 17 | | | | | Verify | Verify |
| 18 | | | | | Skip | Verify |
| 19 | | | | | Skip | Verify |
| 20 | | | | | Skip | Verify |

FIG. 22

COMPARATIVE EXAMPLE

| LW | A LEVEL | | B LEVEL | | C LEVEL | |
|---|---|---|---|---|---|---|
| | Va' | Va | Vb' | Vb | Vc' | Vc |
| 1 | Verify | Verify | Verify | Verify | Verify | Verify |
| 2 | Verify | Verify | Verify | Verify | Verify | Verify |
| 3 | Verify | Verify | Verify | Verify | Verify | Verify |
| 4 | Verify | Verify | Verify | Verify | Verify | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Verify | Verify | Verify | Verify | Verify | Verify |
| 9 | Verify | Verify | Verify | Verify | Verify | Verify |
| 10 | Verify | Verify | Verify | Verify | Verify | Verify |
| 11 | | | Verify | Verify | Verify | Verify |
| 12 | | | Verify | Verify | Verify | Verify |
| 13 | | | Verify | Verify | Verify | Verify |
| 14 | | | Verify | Verify | Verify | Verify |
| 15 | | | Verify | Verify | | |

EMBODIMENT

| LW | A LEVEL | | B LEVEL | | C LEVEL | |
|---|---|---|---|---|---|---|
| | Va' | Va | Vb' | Vb | Vc' | Vc |
| 1 | Verify | Verify | Verify | Verify | Verify | Verify |
| 2 | Verify | Verify | Verify | Verify | Verify | Verify |
| 3 | Verify | Verify | Verify | Verify | Verify | Verify |
| 4 | Verify | Verify | Verify | Verify | Verify | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Skip | Verify | Verify | Verify | Verify | Verify |
| 9 | Skip | Verify | Verify | Verify | Verify | Verify |
| 10 | Skip | Verify | Verify | Verify | Verify | Verify |
| 11 | | | Verify | Verify | Verify | Verify |
| 12 | | | Verify | Verify | Verify | Verify |
| 13 | | | Skip | Verify | Verify | Verify |
| 14 | | | Skip | Verify | Skip | Verify |
| 15 | | | Skip | Verify | Skip | |

FIG. 24

| LW | A LEVEL | | B LEVEL | | C LEVEL | |
|---|---|---|---|---|---|---|
| | Va' | Va | Vb' | Vb | Vc' | Vc |
| 1 | Skip | Verify | Skip | Verify | Skip | Verify |
| 2 | Skip | Verify | Skip | Verify | Skip | Verify |
| 3 | Verify | Verify | Skip | Verify | Skip | Verify |
| 4 | Verify | Verify | Skip | Verify | Skip | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Skip | Verify | Verify | Verify | Verify | Verify |
| 9 | Skip | Verify | Verify | Verify | Verify | Verify |
| 10 | Skip | Verify | Verify | Verify | Verify | Verify |
| 11 | | | Verify | Verify | Verify | Verify |
| 12 | | | Verify | Verify | Verify | Verify |
| 13 | | | Skip | Verify | Skip | Verify |
| 14 | | | Skip | Verify | Skip | Verify |
| 15 | | | Skip | Verify | | |

FIG. 25

| LW | A LEVEL | | B LEVEL | | C LEVEL | |
|---|---|---|---|---|---|---|
| | Va' | Va | Vb' | Vb | Vc' | Vc |
| 1 | Skip | Skip | Skip | Skip | Skip | Skip |
| 2 | Skip | Verify | Skip | Skip | Skip | Skip |
| 3 | Verify | Verify | Skip | Skip | Skip | Skip |
| 4 | Verify | Verify | Skip | Verify | Skip | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Skip | Verify | Verify | Verify | Verify | Verify |
| 9 | Skip | Verify | Verify | Verify | Verify | Verify |
| 10 | Skip | Verify | Verify | Verify | Verify | Verify |
| 11 | | | Verify | Verify | Verify | Verify |
| 12 | | | Verify | Verify | Verify | Verify |
| 13 | | | Skip | Verify | Skip | Verify |
| 14 | | | Skip | Verify | Skip | Verify |
| 15 | | | Skip | Verify | | |

FIG. 26

COMPARATIVE EXAMPLE

| LW | A LEVEL | | B LEVEL | | C LEVEL | |
|---|---|---|---|---|---|---|
| | Va' | Va | Vb' | Vb | Vc' | Vc |
| 1 | Verify | Verify | Verify | Verify | Verify | Verify |
| 2 | Verify | Verify | Verify | Verify | Verify | Verify |
| 3 | Verify | Verify | Verify | Verify | Verify | Verify |
| 4 | Verify | Verify | Verify | Verify | Verify | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Verify | Verify | Verify | Verify | Verify | Verify |
| 9 | Verify | Verify | Verify | Verify | Verify | Verify |
| 10 | Verify | Verify | | | Verify | Verify |
| 11 | | | | | Verify | Verify |
| 12 | | | | | Verify | Verify |
| 13 | | | | | Verify | Verify |
| 14 | | | | | Verify | Verify |
| 15 | | | | | Verify | Verify |

EMBODIMENT

| LW | A LEVEL | | B LEVEL | | C LEVEL | |
|---|---|---|---|---|---|---|
| | Va' | Va | Vb' | Vb | Vc' | Vc |
| 1 | Verify | Verify | Verify | Verify | Verify | Verify |
| 2 | Verify | Verify | Verify | Verify | Verify | Verify |
| 3 | Verify | Verify | Verify | Verify | Verify | Verify |
| 4 | Verify | Verify | Verify | Verify | Verify | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Skip | Verify | Verify | Verify | Verify | Verify |
| 9 | Skip | Verify | Skip | Verify | Verify | Verify |
| 10 | Skip | Verify | Skip | Verify | Verify | Verify |
| 11 | | | | | Verify | Verify |
| 12 | | | | | | Verify | Verify |
| 13 | | | | | Skip | Verify |
| 14 | | | | | Skip | Verify |
| 15 | | | | | Skip | Verify |

FIG. 28

| LW | A LEVEL | | B LEVEL | | C LEVEL | |
|---|---|---|---|---|---|---|
| | Va' | Va | Vb' | Vb | Vc' | Vc |
| 1 | Skip | Verify | Skip | Verify | Skip | Verify |
| 2 | Skip | Verify | Skip | Verify | Skip | Verify |
| 3 | Verify | Verify | Skip | Verify | Skip | Verify |
| 4 | Verify | Verify | Skip | Verify | Skip | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Skip | Verify | Skip | Verify | Verify | Verify |
| 9 | Skip | Verify | Skip | Verify | Verify | Verify |
| 10 | Skip | Verify | | | Verify | Verify |
| 11 | | | | | Verify | Verify |
| 12 | | | | | Verify | Verify |
| 13 | | | | | Skip | Verify |
| 14 | | | | | Skip | Verify |
| 15 | | | | | Skip | Verify |

FIG. 29

| LW | A LEVEL | | B LEVEL | | C LEVEL | |
|---|---|---|---|---|---|---|
|  | Va' | Va | Vb' | Vb | Vc' | Vc |
| 1 | Skip | Skip | Skip | Skip | Skip | Skip |
| 2 | Skip | Verify | Skip | Skip | Skip | Skip |
| 3 | Verify | Verify | Skip | Skip | Skip | Skip |
| 4 | Verify | Verify | Skip | Verify | Skip | Verify |
| 5 | Verify | Verify | Verify | Verify | Verify | Verify |
| 6 | Verify | Verify | Verify | Verify | Verify | Verify |
| 7 | Verify | Verify | Verify | Verify | Verify | Verify |
| 8 | Skip | Verify | Skip | Verify | Verify | Verify |
| 9 | Skip | Verify | Skip | Verify | Verify | Verify |
| 10 | Skip | Verify |  |  | Verify | Verify |
| 11 |  |  |  |  | Verify | Verify |
| 12 |  |  |  |  | Verify | Verify |
| 13 |  |  |  |  | Skip | Verify |
| 14 |  |  |  |  | Skip | Verify |
| 15 |  |  |  |  | Skip | Verify |

FIG. 30

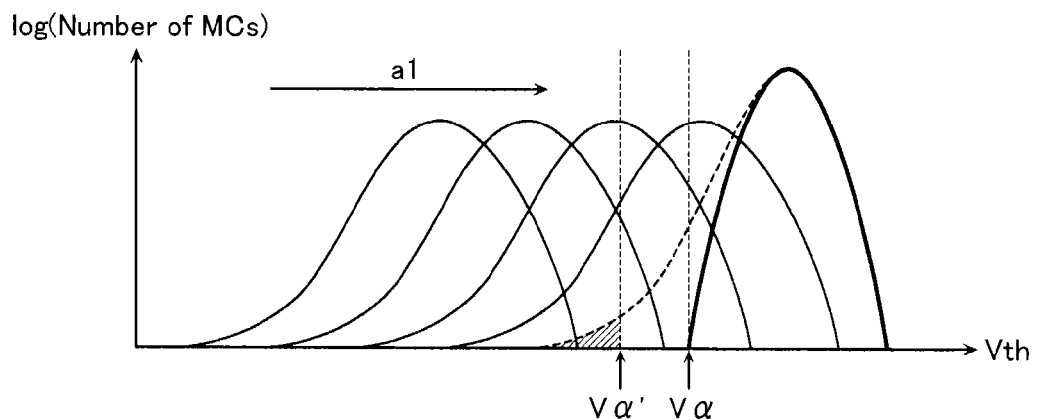

NONVOLATILE SEMICONDUCTOR STORAGE DEVICE

CROSS-REFERENCE TO RELATED APPLICATIONS

This application is based upon and claims the benefit of priority from the prior Japanese Patent Application No. 2011-207850, filed on Sep. 22, 2011, the entire contents of which are incorporated herein by reference.

FIELD

Embodiments described herein relates generally to a nonvolatile semiconductor storage device.

BACKGROUND

A data write method in which an operating technique, what is called a Quick Pass Write method, is used has been proposed as a technique of improving reliability of the nonvolatile semiconductor storage device.

A verify operation in which, in addition to a verify voltage (hereinafter referred to as a "real verify voltage") that is provided in a lower limit of a threshold voltage distribution set in each piece of data, another verify voltage (hereinafter referred to as a "preverify voltage") that is slightly lower than the real verify voltage is used is performed in the QPW method.

A normal program operation is performed until a threshold voltage of a memory cell transitions to the preverify voltage, and a fine program operation in which a transition width of the threshold voltage is narrowed is performed after the threshold voltage exceeds the preverify voltage. As a result, the threshold voltage distribution of the memory cell can be prevented from being widened.

However, in the data write in which the QPW method is adopted, a processing time tends to be lengthened during the data write because many detection operations are required in the verify operation.

BRIEF DESCRIPTION OF THE DRAWINGS

FIG. 10 is a view illustrating execution/omission of a verify step in each write loop during the write sequence of the nonvolatile semiconductor storage device of the first embodiment;

FIG. 11 is a view illustrating an effect of the write sequence of the nonvolatile semiconductor storage device of the first embodiment;

FIG. 13 is a view illustrating a principle of a write sequence of a nonvolatile semiconductor storage device according to a second embodiment;

FIG. 14 is a view illustrating an effect of the write sequence of the nonvolatile semiconductor storage device of the second embodiment;

FIG. 15 is a view illustrating execution/omission of a verify step in each write loop during a write sequence of the nonvolatile semiconductor storage device of the second embodiment;

FIG. 19 is a view illustrating execution/omission of a verify step in each write loop during a write sequence of the nonvolatile semiconductor storage device of the third embodiment;

FIG. 21 is a view illustrating execution/omission of a verify step in each write loop during the write sequence of the nonvolatile semiconductor storage device of the third embodiment;

FIG. 22 is a view illustrating execution/omission of a verify step in each write loop during a write sequence of a nonvolatile semiconductor storage device according to a fourth embodiment;

FIG. 24 is a view illustrating execution/omission of a verify step in each write loop during the write sequence of the nonvolatile semiconductor storage device of the fourth embodiment;

FIG. 25 is a view illustrating execution/omission of a verify step in each write loop during the write sequence of the nonvolatile semiconductor storage device of the fourth embodiment;

FIG. 26 is a view illustrating execution/omission of a verify step in each write loop during a write sequence of a nonvolatile semiconductor storage device according to a fifth embodiment;

FIG. 28 is a view illustrating execution/omission of a verify step in each write loop during the write sequence of the nonvolatile semiconductor storage device of the fifth embodiment;

FIG. 29 is a view illustrating execution/omission of a verify step in each write loop during the write sequence of the nonvolatile semiconductor storage device of the fifth embodiment;

FIG. 30 is a view illustrating a transition state of a threshold voltage distribution of a memory cell group during a write sequence of the nonvolatile semiconductor storage device according to a sixth embodiment;

DETAILED DESCRIPTION

A nonvolatile semiconductor storage device according to an embodiment includes: a memory cell array including plural memory cells each of which stores data by plural different threshold voltages in a nonvolatile manner; and a control circuit that repeatedly performs a write loop including a program operation to cause the threshold voltage of the memory cell to transition and a verify operation to check whether the threshold voltage of the memory cell in the program operation transitions to a first value in data write performed to the memory cell, the verify operation including a preverify step to check whether the threshold voltage of the memory cell transitions to a preverify voltage, which is set to a value lower than that of a real verify voltage indicating a lower limit of a first threshold voltage of the memory cell, and a real verify step to check whether the threshold voltage of the memory cell transitions to the real verify voltage, the write loop including one or at least two verify operations corresponding to pieces of the data, the control circuit performing the write loop in which the preverify step of the verify operation corresponding to a first data is omitted after obtaining a first condition.

Hereinafter, nonvolatile semiconductor storage devices according to embodiments will be described with reference to the drawings.

First Embodiment

Entire Configuration

An entire configuration of a nonvolatile semiconductor storage device according to a first embodiment will be described below.

Figure 1:
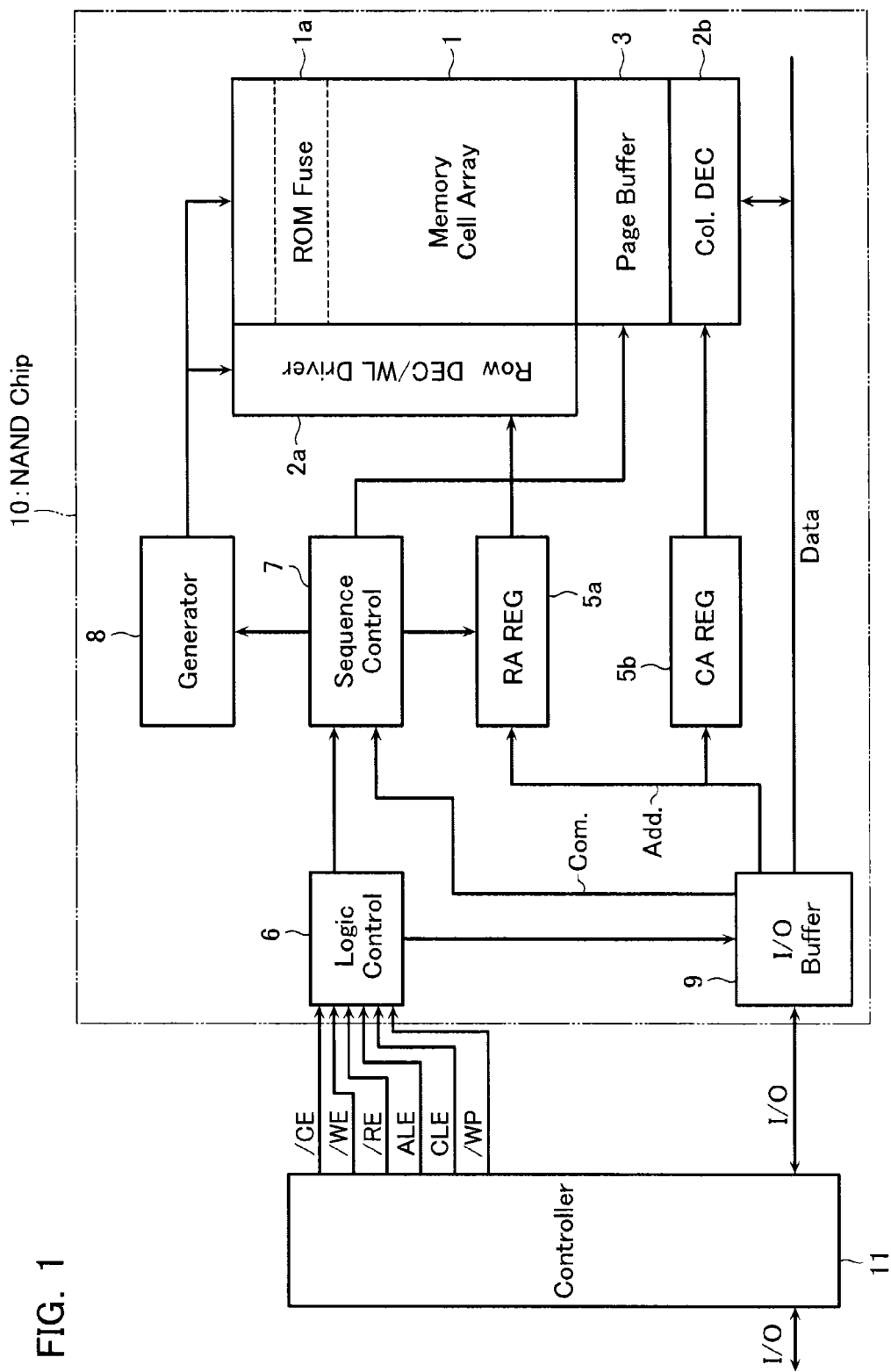
FIG. 1 is a block diagram illustrating a nonvolatile semiconductor storage device according to a first embodiment.

FIG. 1 is a block diagram illustrating the nonvolatile semiconductor storage device of the first embodiment.

A NAND flash memory includes a NAND chip 10 and a controller 11 that controls the NAND chip 10.

As described later, a memory cell array 1 constituting the NAND chip 10 is constructed by two-dimensionally arraying plural floating gate memory cells. A ROM fuse region 1*a* that cannot be accessed from a user may be provided in the memory cell array 1 as needed. Various pieces of information necessary to control the device during data write are stored in the ROM fuse region 1*a*.

A row decoder/word line driver 2*a*, a column decoder 2*b*, a page buffer 3, and a voltage generator 8 are disposed around the memory cell array 1. The row decoder/word line driver 2*a*, the column decoder 2*b*, the page buffer 3, and the voltage generator 8 constitute a control circuit, and data is written in and read from the memory cell array 1 in units of pages.

The row decoder/word line driver 2*a* drives a word line and a selection gate line of the memory cell array 1. The page buffer 3 includes a sense amplifier and a data retaining circuit for one page. Columns of the read data of one page of the page buffer 3 are sequentially selected by the column decoder 2*b*, and output to an external I/O terminal through an I/O buffer 9. The write data supplied from the external I/O terminal is selected by the column decoder 2*b* and loaded on the page buffer 3. The write data of one page is loaded on the page buffer 3. A row address signal and a column address signal are input through the I/O buffer 9, and transferred to the row decoder 2*a* and the column decoder 2*b*, respectively. A row address register 5*a* retains an erasing block address in an erasing operation, and retains a page address in a write operation and a read operation. A head column address is input to a column address register 5*b* in order to load the write data before starting of the write operation, and a head column address for the read operation is input to the column address register 5*b*. The column address register 5*b* retains the input column address until a write enable signal /WE or a read enable signal /RE is toggled under a predetermined condition.

A logic control 6 controls an input of a command or an address and input/output of the data based on control signals such as a chip enable signal /CE, a command enable signal CLE, an address latch enable signal ALE, the write enable signal /WE, and the read enable signal /RE. The read operation and the write operation are executed by the command. In response to the command, a sequence control 7 performs a sequence of the read operation, the write operation, or the erasing operation. The voltage generator 8 generates a predetermined voltage necessary for various operations under the control of the sequence control 7.

The controller 11 controls the data write and the data read on the condition suitable for a current write state of the NAND chip 10. The write operation may be partially performed on the side of the NAND chip 10.

<Memory Cell Array>

The memory cell array 1 of the nonvolatile semiconductor storage device of the first embodiment will be described below.

Figure 2:
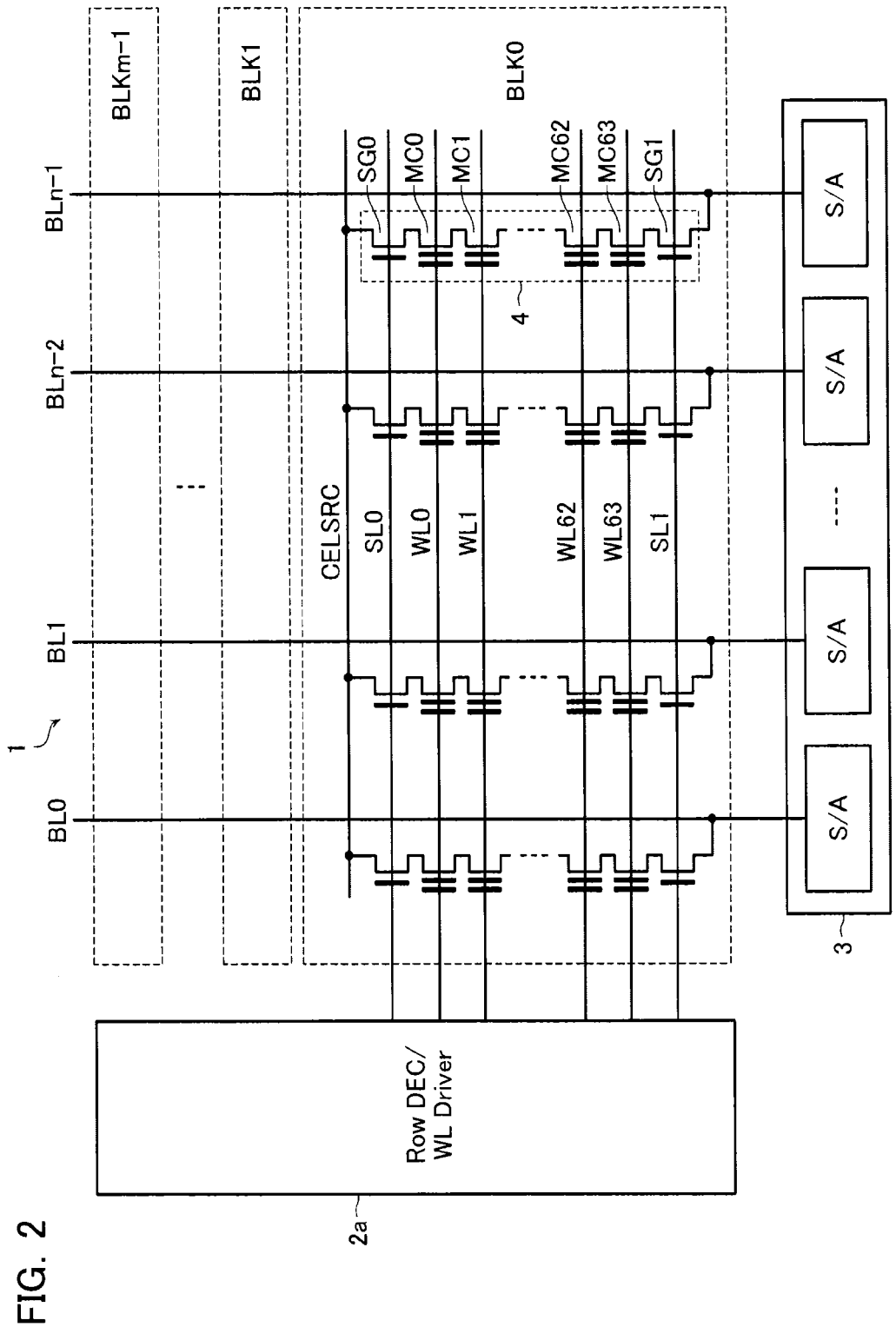
FIG. 2 is a circuit diagram illustrating the nonvolatile semiconductor storage device of the first embodiment.

FIG. 2 is a circuit diagram of the memory cell array 1. Referring to FIG. 2, a NAND string 4 includes 64 memory cells MC0 to MC63 that are connected in series and selection gate transistors SG0 and SG1 that are connected to both ends of the series-connected memory cells MC0 to MC63. A source of the selection gate transistor SG0 is connected to a common source line CELSRC, and a drain of the selection gate transistor SG1 is connected to a bit line BL (BL0 to BLn−1). Control gates of the memory cells MC0 to MC63 are connected to word lines WL (WL0 to WL63), respectively, and gates of the selection gate transistors SG0 and SG1 are connected to selection gate lines SL0 and SL1.

A range of the plural memory cells MC along one word line WL constitutes a page that becomes a unit of collective data read or collective data write. A range of the plural NAND strings 4 arrayed in a direction of the word line WL constitutes a block BLK that becomes a unit of collective data erasing. In FIG. 2, plural blocks BLK0 to BLKm−1 that share the bit line BL are arrayed in the direction of the bit line BL, thereby constituting the memory cell array 1. The word line WL and the selection gate lines SL0 and SL1 are driven by the row decoder 2a. Each bit line BL is connected to a sense amplifier S/A of the page buffer 3.

The "page" that is of an access unit of the NAND flash memory will be described. In the following description, it is noted that the "page" has two different meanings.

First the "page" means a collective data access unit along one word line. Second the "page" means a hierarchy of storage data when plural bits are stored in one memory cell. In this case, the "page" is called an "L (Lower) page", a "U (Upper) page" or the like.

<Write Sequence of Quick Pass Write Method>

The following terms will be described prior to the description of the data write of the first embodiment.

A series of pieces of processing performed during the data write is called a "write sequence". The write sequence is performed by a repetition of a "write loop", and the write loop includes a "program operation" to cause a threshold voltage of the memory cell to transition actually and a "verify operation" to check the threshold voltage of the memory cell. Each program operation includes one or at least two "program steps". In each program step, a program voltage necessary for the transition of the threshold voltage of the memory cell is applied once to the word line. Each verify operation includes one or at least two "verify steps". In each verify step, an operation to detect the threshold voltage of the memory cell is performed once using a predetermined verify voltage. Sometimes the verify step is referred to as a "real verify step" or a "preverify step" according to the intended use. The real verify step and the preverify step are described in detail later.

The write sequence of the first embodiment will be described below.

Figure 3:
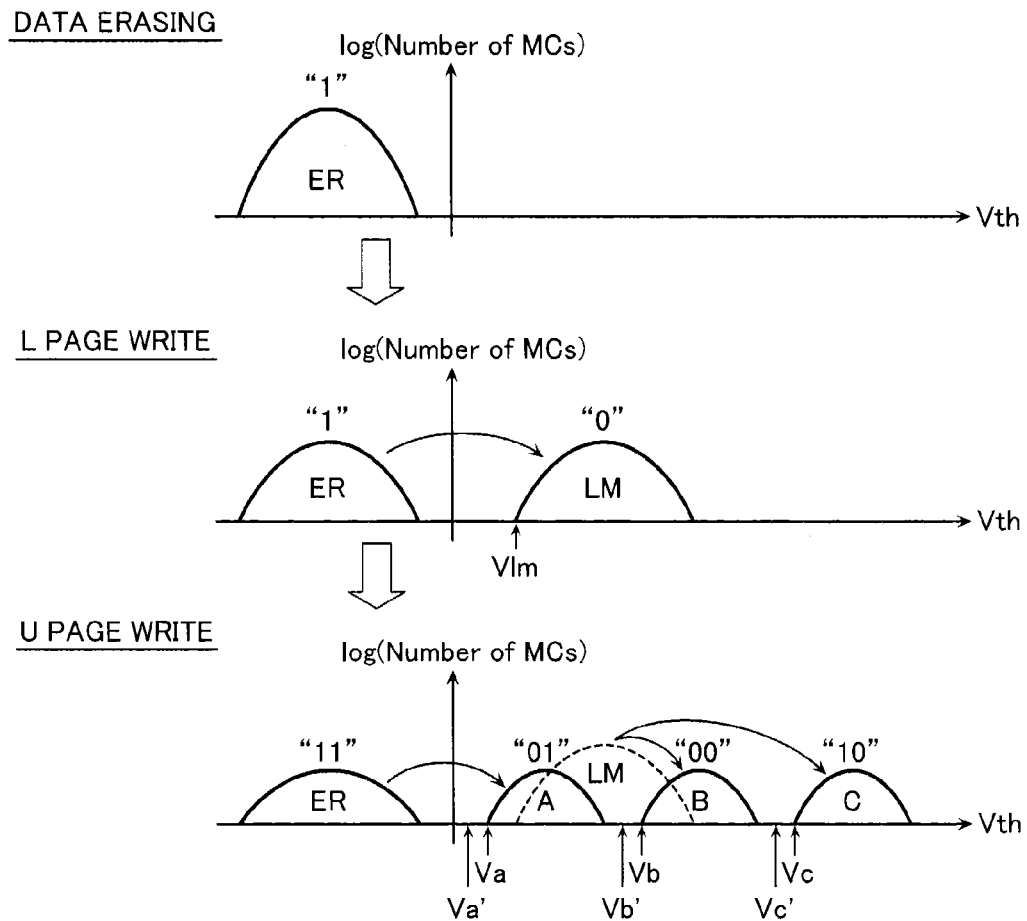
FIG. 3 is a view illustrating a transition state of a threshold voltage distribution of a memory cell group during a write sequence of the nonvolatile semiconductor storage device of the first embodiment.

FIG. 3 is a view illustrating a transition state of a threshold voltage distribution of a memory cell group during the write sequence in which the memory cell having 2 bits/cell is used.

At first the data is erased. The data erasing is collectively performed to the whole block. As a result, the threshold voltages of all the memory cells in the block become the lowest ER level.

Then L page write is performed. The L page write is performed based on a lower bit of the write data. In the case of the lower bit of "1", the threshold voltage of the memory cell is maintained at the ER level. In the case of the lower bit of "0", the threshold voltage of the memory cell is located at an intermediate level between an A level and a B level, and a lower limit of the threshold voltage distribution of the memory cell group transitions from the ER level to an LM level higher than a voltage Vlm. However, sometimes the threshold voltage distribution of the memory cell group may be lower than the voltage Vlm until the number of bits in which an ECC repair can be performed. Hereinafter, "that the level of the threshold voltage of the memory cell is higher than the voltage" means that "the lower limit of the threshold voltage distribution is higher than the voltage".

Finally U page write is performed. The U page write is performed based on a higher bit of the write data. When the threshold voltage of the memory cell is at the ER level, the threshold voltage of the memory cell is maintained at the ER level in the case of the higher bit of "1". On the other hand, in the case of the higher bit of "0", the threshold voltage of the memory cell transitions to the A level higher than a voltage Va (Va<Vim). When the threshold voltage of the memory cell is at the LM level, the threshold voltage of the memory cell transitions to the B level higher than a voltage Vb (Va<Vb) in the case of the higher bit of "0". On the other hand, in the case of the higher bit of "1", the threshold voltage of the memory cell transitions to a C level higher than a voltage Vc (Vb<Vc).

Thus, the 2-bit data write in the memory cell is performed in two stages of the L page write and the U page write. As described above, the write of each page is performed by the repetition of the write loop.

In the first embodiment, the write sequence, what is called a quick pass write method, is used as an operation method. Hereinafter the quick pass write method is referred to as a "QPW method". Sometimes the write sequence of the QPW method is simply referred to as a "write sequence".

The QPW method is an operation method characterized by adjusting a transition amount of the threshold voltage of the memory cell in the next write loop according to a result of the verify operation in a certain write loop. Hereinafter the transition amount of the threshold voltage of the memory cell in the case that a predetermined program voltage is applied, namely, easiness of the transition of the threshold voltage of the memory cell is referred to as a "program speed".

Figure 4:
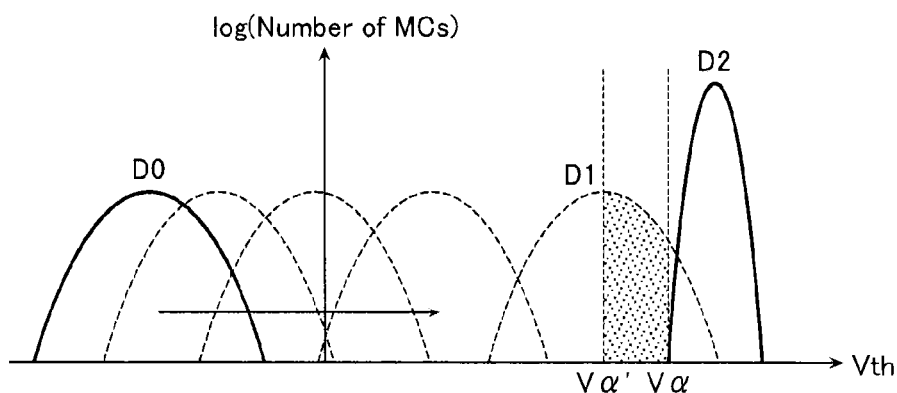
FIG. 4 is a view illustrating the transition state of the threshold voltage distribution of the memory cell group during a write sequence of a quick pass write method.
Figure 5:
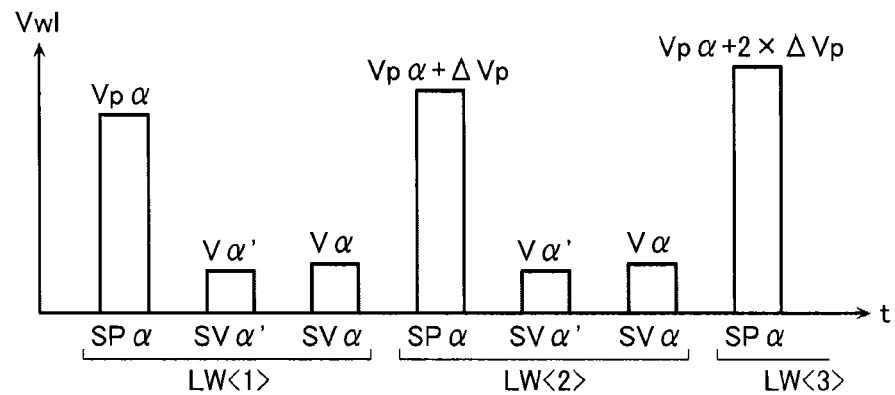
FIG. 5 is a view illustrating a state of a voltage applied to a word line during the write sequence of the quick pass write method.
Figure 6:
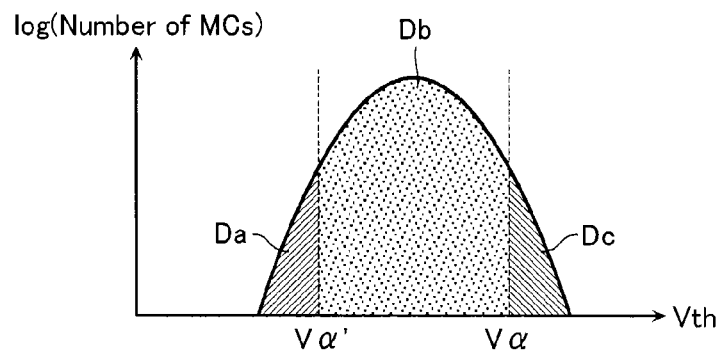
FIG. 6 is a view illustrating a control segment during the write sequence of the quick pass write method.

FIG. 4 is a view illustrating the transition state of the threshold voltage distribution of the memory cell group during the write sequence. FIG. 5 is a view illustrating a state of a voltage Vwl applied to the word line during the write sequence. FIG. 6 is a view illustrating a control segment of the write sequence.

FIG. 4 illustrates an example in which the threshold voltage distribution of the memory cell group is caused to transition from a distribution D0 to a distribution D2.

In the write sequence of the first embodiment, as described above, a write loop LW including the program operation and the verify operation is repeatedly performed.

In a program step SP$\alpha$ of each write loop LW, a program voltage Vp$\alpha$ to cause the threshold voltage of the memory cell to transition to a voltage V$\alpha$ (corresponding to the voltages Va, Vb, and Vc of FIG. 3) is applied to the word line. As illustrated in FIG. 5, the program voltage Vp$\alpha$ is stepped up by $\Delta$Vp as the number of times of the write loop LW is increased.

In the verify operation of each write loop LW, the verify step is performed twice at each level. The first-time verify step is a preverify step SV$\alpha$' (corresponding to voltages Va', Vb', and Vc' of FIG. 3). The preverify step SV$\alpha$' is a verify step in which a preverify voltage V$\alpha$' is used. The preverify voltage V$\alpha$' is set slightly lower than the lower limit of the set threshold voltage distribution D2. The second-time verify step is a real verify step SV$\alpha$. The real verify step SV$\alpha$ is a verify step in which a real verify voltage V$\alpha$ is used. The real verify voltage V$\alpha$ is set to the lower limit of the desired threshold voltage distribution D2.

The characteristic of the write sequence of the QPW method is described above. Specifically, it is determined to which segmentation of Vth$\leq$V$\alpha$' (threshold voltage distribution Da of FIG. 6), V$\alpha$'<Vth$\leq$V$\alpha$ (threshold voltage distribution Db of FIG. 6), and V$\alpha$<Vth (threshold voltage distribution Dc of FIG. 6) a threshold voltage Vth of the memory cell belongs by the verify operation in the predetermined write loop LW. As a result, when the threshold voltage Vth of the memory cell is Vth$\leq$V$\alpha$', the normal program operation is performed in the next write loop LW. On the other hand, when the threshold voltage Vth of the memory cell is V$\alpha$'<Vth$\leq$V$\alpha$, the fine program operation is performed in the next write loop LW while a program speed is suppressed. For example, the program speed can be adjusted by applying a predetermined voltage to the bit line BL. When the threshold voltage Vth of the memory cell MC is V$\alpha$<Vth, the program operation of the next write loop LW is prohibited. For example, the prohibition of the program operation may be performed by applying a power supply voltage Vdd to the bit line BL.

The fine program operation can be performed to the memory cell MC (for example, located in the distribution D1 of FIG. 4), in which the threshold voltage distribution of the threshold voltage Vth of the memory cell group almost exceeds the real verify voltage Vα at the time the predetermined write loop LW is ended, by the write loop LW. Therefore, as illustrated by the distribution D2 of FIG. 4, the narrow threshold voltage distribution can be obtained by the write sequence of the QPW method.

However, in the case of the write sequence of the QPW method, the write sequence processing time tends to be lengthened because the number of verify steps is increased in the verify operation.

Therefore, in the first embodiment, the write sequence processing time is attempted to be shortened by omitting the useless preverify step.

Figure 7:
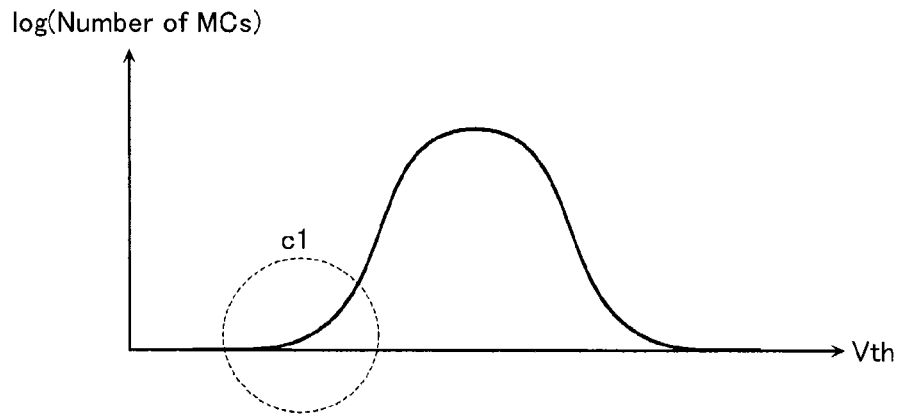
FIG. 7 is a view illustrating a principle of the write sequence of the nonvolatile semiconductor storage device of the first embodiment.

FIG. 7 illustrates the threshold voltage distribution of the memory cell group in the one-time program operation, and the lower limit side becomes the threshold voltage distribution of the memory cell group that does not reach the real verify voltage. That is, the program speed of the memory cell MC becomes slower as the memory cell MC is located on the lower limit side of the threshold voltage distribution. As used herein, the useless preverify step means a preverify step that is performed to the memory cells MC located on a lower foot side of the threshold voltage distribution as illustrated by a dotted line circle c1 of FIG. 7. This is because the program speeds of the memory cells MC are originally slow due to a process variation and the like. Even if the slightly rough program operation is performed to the memory cells MC having the slow program speeds, the threshold voltages of the memory cells MC having the slow program speeds rarely exceed an upper limit of the desired threshold voltage distribution. That is, originally the write sequence of the QPW method is not necessary for the memory cells MC having the slow program speeds. Then, the threshold voltage distribution of the memory cells MC having the slow program speed is narrow even if the preverify step is omitted.

In the first embodiment, whether the program speed of the memory cell MC is slow is determined using the number of write loops. Specifically, the memory cell in which the threshold voltage does not exceed the real verify voltage at the time the predetermined number of write loops is performed is dealt with as the memory cell having the slow program speed.

Figure 8:
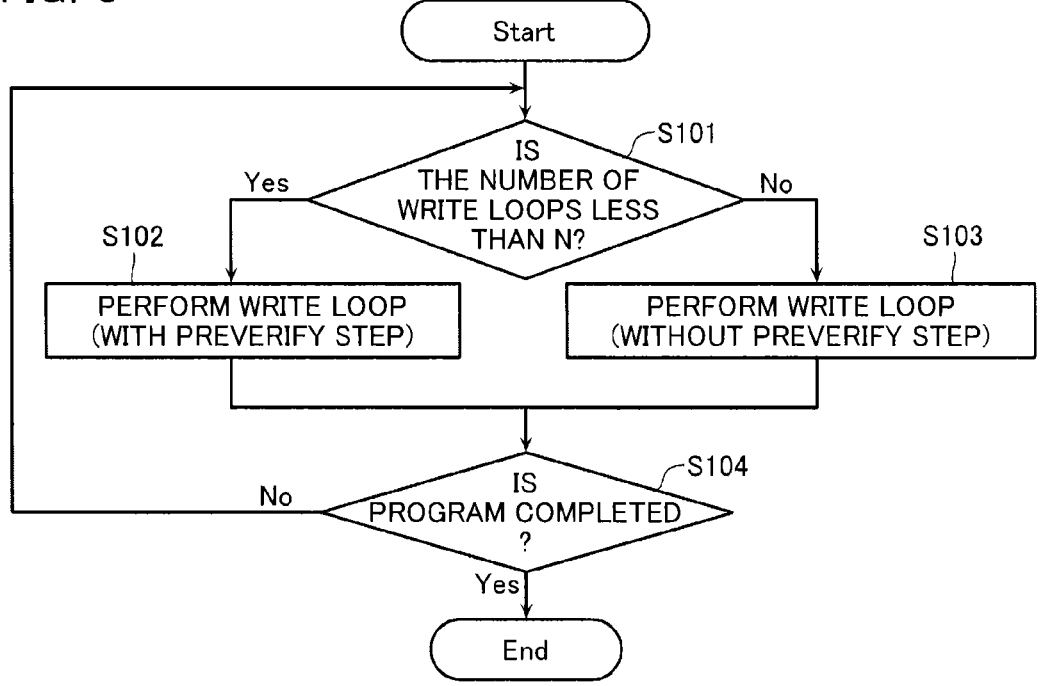
FIG. 8 is a flowchart illustrating the write sequence of the nonvolatile semiconductor storage device of the first embodiment.

FIG. 8 illustrates the write sequence in this case. In the write sequence of the first embodiment, the sequence control 7 determines whether the number of write loops is lower than a predetermined number N (Step S101 of FIG. 8). When the number of write loops is lower than the predetermined number N, the sequence control 7 performs the write loop including the preverify step (Step S102 of FIG. 8). When the number of write loops is not lower than the predetermined number N, the sequence control 7 performs the write loop in which the preverify step is omitted (Step S103 of FIG. 8). The sequence control 7 repeatedly performs the pieces of processing in Steps S101 to S103 until the program is completed to the memory cell (Step S104 of FIG. 8). For example, the set number N may previously be recorded in the ROM fuse region 1a. The set number N and a write command may simultaneously be sent from the controller 11 to the NAND chip 10.

Hereinafter, sometimes the condition that the preverify step Vα' performed to the memory cell MC having the slow program speed is omitted is referred to as a "first preverify step omitting condition" (first condition).

Figure 9:
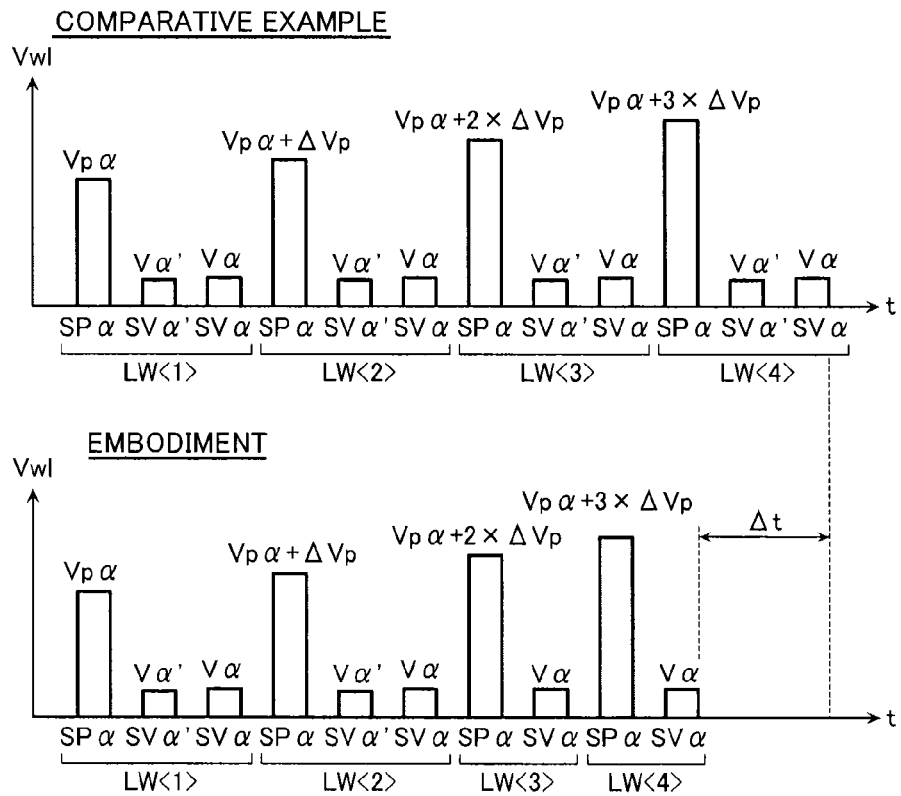
FIG. 9 is a view illustrating an effect of the write sequence of the nonvolatile semiconductor storage device of the first embodiment.

FIG. 9 is a view illustrating an effect of the write sequence of the nonvolatile semiconductor storage device of the first embodiment. In FIG. 9, each write loop LW is expressed by the voltage Vwl applied to the word line WL for the purpose of easy understanding of the write loop LW. FIG. 9 also illustrates a comparative example in which the write sequence, in which the preverify step SVα' is not omitted in the whole write loop LW, is used.

In the following descriptions, the write sequence, in which the preverify step SVα' is not omitted in the whole write loop LW, is used in the comparative example.

In the example of FIG. 9, the write sequence is completed by four write loops LW<1> to LW<4>, and the number of write loops of 3 or more is set to the first preverify step omitting condition.

In FIG. 9, because the preverify steps SVα' of the third and fourth write loops LW<3> and LW<4> are omitted, the write sequence processing time can be shortened by a time Δt, for which the preverify step SVα' is processed twice, compared with the comparative example.

The case that the write sequence of FIGS. 8 and 9 is applied to a nonvolatile semiconductor storage device in which the memory cell MC having 2 bits/cell is used will be described below with reference to FIGS. 10 and 11.

FIG. 10 is a view illustrating the execution/omission of the preverify step and the real verify step in each write loop of the write sequence in the case that the write sequence of the first embodiment is applied to the nonvolatile semiconductor storage device in which the memory cell MC having 2 bits/cell is used. FIG. 11 is a view illustrating an effect of the write sequence of FIG. 10.

In the example of FIGS. 10 and 11, after the L page write, the programs at the A level, the B level and the C level are collectively performed through a program step SP in the U page write. Accordingly, the program step SP is performed only once in the program operation. Alternatively, L page write is not performed, but the programs at the A level, the B level and the C level may collectively be performed through the program step SP only in the U page write.

The numbers of write loops performed for the programs at the A level, the B level, and the C level are set to 10 times, 15 times, and 20 times, respectively. The first preverify step omitting conditions at the A level, the B level, and the C level are set to the numbers of write loops of 8 times, 13 times, and 18 times, respectively.

In this case, as illustrated on the right side of FIG. 10 and the lower side of FIG. 11, the total of pieces of processing of 7 steps including the program step SP, a preverify step SVα' and a real verify step SVα performed to the A level, a preverify step SVb' and a real verify step SVb performed to the B level, and a preverify step SVc' and a real verify step SVc performed to the C level is performed in the first write loop LW<1>. The subsequent second to seventh write loops LW<2> to LW<7> are identical to the first write loop LW<1>.

The preverify step SVα' performed to the A level is omitted from the eighth write loop LW<8>. Therefore, the total of pieces of processing of 6 steps is performed in the eighth write loop LW<8>. The subsequent ninth and tenth write loops LW<9> and LW<10> are identical to the eighth write loop LW<8>.

Therefore, the program at the A level is completed to the memory cell MC. Accordingly, the program operation and the verify operation are omitted for the A level from the subsequent write loops LW.

The total of pieces of processing of 5 steps is performed in the eleventh write loop LW<11>. The subsequent twelfth write loop LW<12> is identical to the eleventh write loop LW<11>.

The preverify step SVb' performed to the B level is omitted from the thirteenth write loop LW<13>. Therefore, the total of pieces of processing of 4 steps is performed in the thirteenth write loop LW<13>.

Therefore, the program at the B level is completed to the memory cell MC. Accordingly, the program operation and the verify operation are omitted for the B level from the subsequent write loops LW.

The total of pieces of processing of 3 steps is performed in the subsequent sixteenth write loop LW<16>. The subsequent seventeenth write loop LW<17> is identical to the sixteenth write loop LW<16>.

The preverify step SVc' performed to the C level is omitted from the eighteenth write loop LW<18>. Therefore, the total of pieces of processing of 2 steps is performed in the eighteenth write loop LW<18>. The subsequent nineteenth write loop LW<19> and the final twentieth write loop LW<20> are identical to the eighteenth write loop LW<18>.

Therefore, in the first embodiment, the write loops LW<1> to LW<20> can be processed through the total of 101 steps.

On the other hand, in the comparative example, as illustrated on the left side of FIG. 10 and the upper side of FIG. 11, the total of pieces of processing of 7 steps is performed in each of the first write loop LW<1> to the tenth write loop LW<10> in which the program at the A level is completed to the memory cell MC. The total of pieces of processing of 5 steps is performed in each of the eleventh write loop LW<11> to the fifteenth write loop LW<15> in which the program at the B level is completed to the memory cell MC. The total of pieces of processing of 3 steps is performed in each of the sixteenth write loop LW<16> to the twentieth write loop LW<20> in which the program at the C level is completed to the memory cell MC.

As described above, in the comparative example, the write loops LW<1> to LW<20> are processed through the total of 110 steps.

Figure 12:
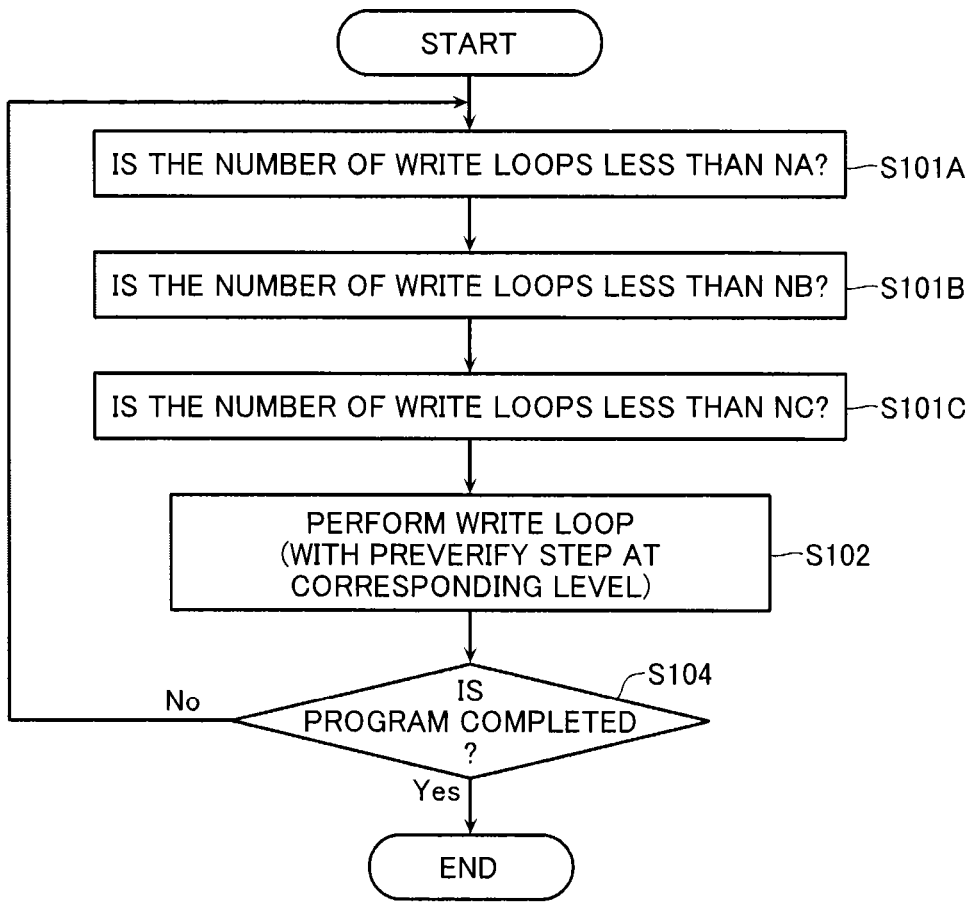
FIG. 12 is a flowchart illustrating a write sequence of the nonvolatile semiconductor storage device of the first embodiment.

FIG. 12 illustrates the write sequence. In the write sequence of the first embodiment, the sequence control 7 determines whether the number of write loops is lower than a set number NA (Step S101A of FIG. 12). Similarly the sequence control 7 determines whether the number of write loops is lower than set numbers NB and NC (Steps S101B and S101C of FIG. 12).

At this point, a relationship of NA<NB<NC holds. In FIG. 10, the sign NA designates the number of write loops of the seventh time, the sign NB designates the number of write loops of the twelfth time, and the sign NC designates the number of write loops of the seventeenth time.

The sequence control 7 determines whether the preverify step at each level is performed or omitted based on which steps S101A to S101C the number of write loops corresponds to (Step S102 of FIG. 12). The sequence control 7 repeatedly performs the pieces of processing in Steps S101A to S102 until the program is completed to the memory cell MC (Step S104 of FIG. 12).

In the first embodiment, as illustrated in FIG. 11, the write sequence processing time can be shortened by 9 steps compared with the comparative example. Even in this case, because only the preverify steps SVa', SVb', and SVc' performed to the memory cells MC having the slow program speed are omitted, broadening of the threshold voltage distribution of the memory cell group can be suppressed to the same degree as the comparative example.

As described above, according to the first embodiment, the write sequence processing time can be shortened while the effect of the write sequence of the QPW method is maintained.

Second Embodiment

In the first embodiment, the write sequence processing time is shortened by omitting the preverify step performed to the memory cell having the slow program speed. On the other hand, in a second embodiment, the preverify step performed to the memory cell having fast program speed is also omitted.

FIG. 13 illustrates a threshold voltage distribution of the memory cell group in the one-time program operation. It is said that the memory cell MC located on the upper limit side of the threshold voltage distribution has faster program speed. As used herein, the memory cell MC having the fast program speed means a memory cell MC that is located on an upper foot side of the threshold voltage distribution as illustrated by a dotted line circle c1 of FIG. 13. The transition amount of the threshold voltage Vth per one-time program operation is increased in the memory cell MC having the fast program speed. Even if the threshold voltage Vth of the memory cell MC is equal to or lower than the preverify voltage Vα', the threshold voltage Vth frequently exceeds the real verify voltage Vα only by the one-time program operation. That is, the memory cell MC belonging to the dotted line circle c1 of FIG. 13 has the threshold voltage higher than the real verify voltage. The memory cell MC having the fast program speed is also generated by the process variation and the like.

As can be seen from the threshold voltage distribution of FIG. 13, the number of memory cells MC having the fast program speed is not so large.

Accordingly, even if the preverify step performed to the memory cell MC having the fast program speed is omitted, the broadening of the threshold voltage distribution of the memory cell group can be suppressed to the same degree as the comparative example.

In the second embodiment, the useless processing time of the preverify step performed to the memory cell MC having the fast program speed is shortened by omitting the preverify step of the write loop performed at an early stage. A disadvantage is not generated in other memory cells MC, because the threshold voltage Vth may not reach the preverify voltage Vα' even if the write loop is performed at the early stage.

Hereinafter, a condition that the preverify step performed to the memory cell MC having the fast program speed is omitted is referred to as a "second preverify step omitting condition" (second condition).

FIG. 14 is a view illustrating an effect of the write sequence of the nonvolatile semiconductor storage device of the second embodiment. In FIG. 14, similarly to FIG. 9, each write loop LW is expressed by the voltage Vwl applied to the word line WL for the purpose of easy understanding of the write loop LW.

In the specific example of FIG. 14, the write sequence is completed by six write loops LW<1> to LW<6>, the number of write loops of 6 or more is set to the first preverify step omitting condition, and the number of write loops of 1 or less is set to the second preverify step omitting condition.

In FIG. 14, because the preverify steps SVα' of the first and sixth write loops LW<1> and LW<6> are omitted, the write sequence processing time can be shortened by a time Δt, for which the preverify step SVα' is processed twice, compared with the comparative example.

Figure 16:
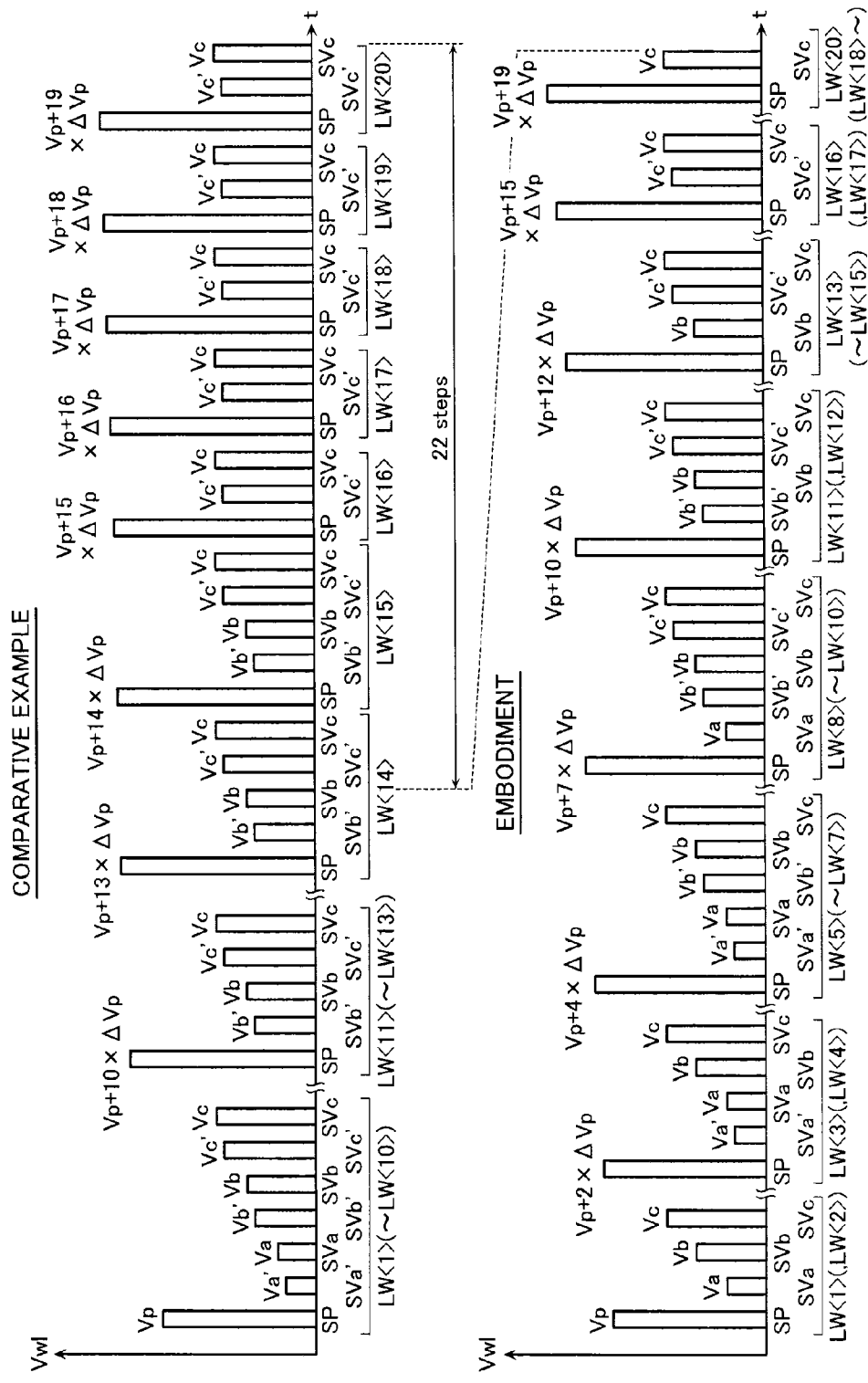
FIG. 16 is a view illustrating an effect of the write sequence of the nonvolatile semiconductor storage device of the second embodiment.

The case that the write sequence of FIGS. 13 and 14 is applied to the nonvolatile semiconductor storage device in which the memory cell MC having 2 bits/cell is used will be described below with reference to FIGS. 15 and 16. In the example of FIGS. 15 and 16, after the L page write, the programs at the A level, the B level and the C level are collectively performed through the program step SP in the U page write. Accordingly, the program step SP is performed only once in the program operation. Alternatively, L page write is not performed, but the programs at the A level, the B level and the C level may collectively be performed through the program step SP only in the U page write.

FIG. 15 is a view illustrating the execution/omission of the preverify step and the real verify step in each write loop of the write sequence in the case that the write sequence of the second embodiment is applied to the nonvolatile semiconductor storage device in which the memory cell MC having 2 bits/cell is used. FIG. 16 is a view illustrating an effect of the write sequence of FIG. 15. Because the comparative example with respect to the specific example of FIG. 15 is identical to that of the left side of FIG. 10, the comparative example is omitted.

In the specific example of FIGS. 15 and 16, the second preverify step omitting conditions at the A level, the B level, and the C level are set to the number of write loops of 2 or less, the number of write loops of 4 or less, and the number of write loops of 7 or less, respectively. Other conditions such as the first preverify step eliminating condition are identical to those of the specific example illustrated on the right side of FIG. 10 and the lower side of FIG. 11.

In this case, as illustrated in FIG. 15 and the lower side of FIG. 16, the preverify steps SVα', SVb', and SVc' performed to the A level, the B level, and the C level are omitted in the first write loop LW<1>. Therefore, the total of pieces of processing of 4 steps is performed in the first write loop LW<1>. The subsequent second write loop LW<2> is identical to the first write loop LW<1>.

The preverify step SVα' is performed to the A level from the third write loop LW<3>. Therefore, the total of pieces of processing of 5 steps is performed in the third write loop LW<3>. The subsequent fourth write loop LW<4> is identical to the third write loop LW<3>.

The preverify step SVb' is performed to the B level from the fifth write loop LW<5>. Therefore, the total of pieces of processing of 6 steps is performed in the fifth write loop LW<5>. The subsequent sixth and seventh write loops LW<6> and LW<7> are identical to the fifth write loop LW<5>.

Because the subsequent eighth to twentieth write loops LW<8> to LW<20> are identical to those of the specific example of FIGS. 10 and 11, the descriptions of the eighth to twentieth write loops LW<8> to LW<20> are omitted.

Therefore, in the second embodiment, the write loops LW<1> to LW<20> can be processed through the total of 88 steps.

As described above, in the comparative example, the write loops LW<1> to LW<20> are processed through the total of 110 steps.

In the second embodiment, as illustrated in FIG. 16, the write sequence processing time can be shortened by 22 steps compared with the comparative example. Even in this case, because only the preverify steps SVα', SVb', and SVc' performed to the memory cells MC having the slow program speed and the memory cells MC having the fast program speed are omitted, the broadening of the threshold voltage distribution of the memory cell group can be suppressed to the same degree as the comparative example.

Figure 17:
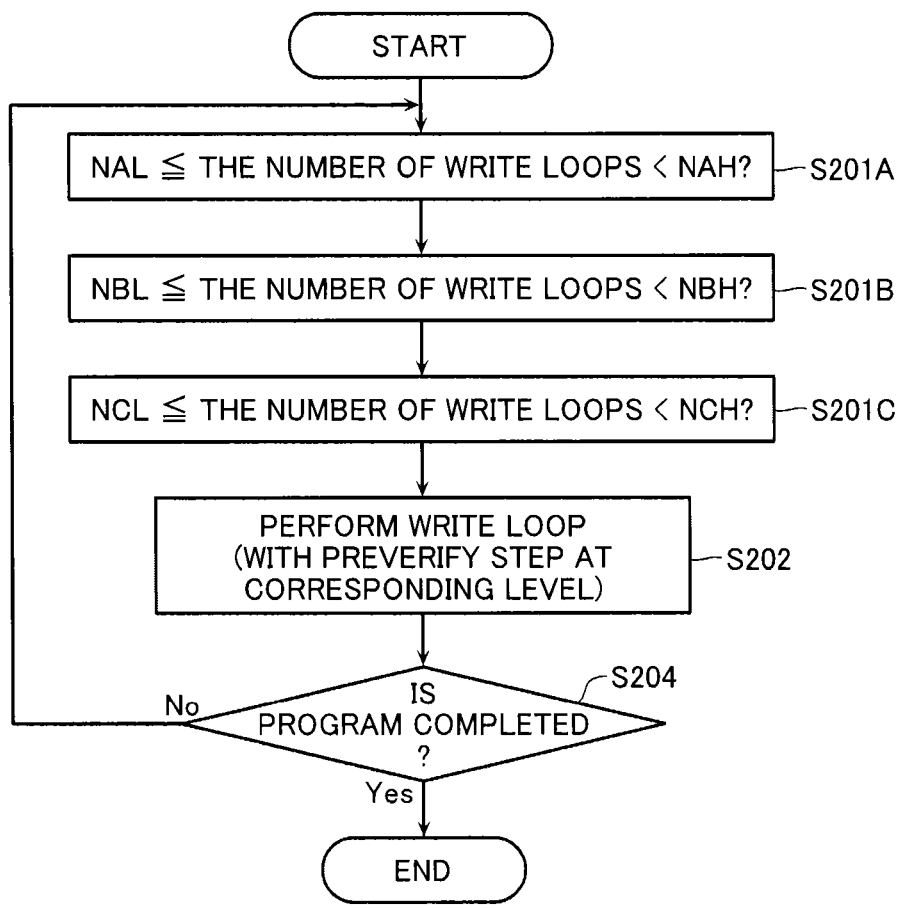
FIG. 17 is a flowchart illustrating the write sequence of the nonvolatile semiconductor storage device of the second embodiment.

FIG. 17 illustrates the write sequence. In the write sequence of the second embodiment, the sequence control 7 determines whether the number of write loops is not lower than a predetermined number NAL and lower than a predetermined number NAH (Step S201A of FIG. 17). Similarly the sequence control 7 determines whether the number of write loops is not lower than predetermined numbers NBL and NCL and lower than predetermined numbers NBH and NCH (Steps S201B and S201C of FIG. 17).

At this point, a relationship of NAH<NBH<NCH holds. A relationship of NAL<NBL<NCL also holds. In FIG. 15, the sign NAH designates the number of write loops of the seventh time, the sign NBH designates the number of write loops of the twelfth time, and the sign NCH designates the number of write loops of the seventeenth time. In FIG. 15, the sign NAL designates the number of write loops of the second time, the sign NBL designates the number of write loops of the fourth time, and the sign NCL designates the number of write loops of the seventh time.

The sequence control 7 determines whether the preverify step at each level is performed or omitted based on which steps S201A to S201C the number of write loops corresponds to (Step S202 of FIG. 17). The sequence control 7 repeatedly performs the pieces of processing in Steps S201A to S202 until the program is completed to the memory cell (Step S204 of FIG. 17).

As described above, according to the second embodiment, the write sequence processing time can further be shortened compared with the first embodiment while the effect of the write sequence of the QPW method is maintained.

Third Embodiment

In the first and second embodiments, the shortening of the write sequence processing time is achieved by omitting the preverify step. On the other hand, in a third embodiment, the real verify step of the write loop is also omitted at an early stage at which the threshold voltage of the memory cell does not reach the real verify voltage.

Hereinafter, a condition that the real verify step is omitted is referred to as a "real verify step omitting condition" (third condition).

Figure 18:
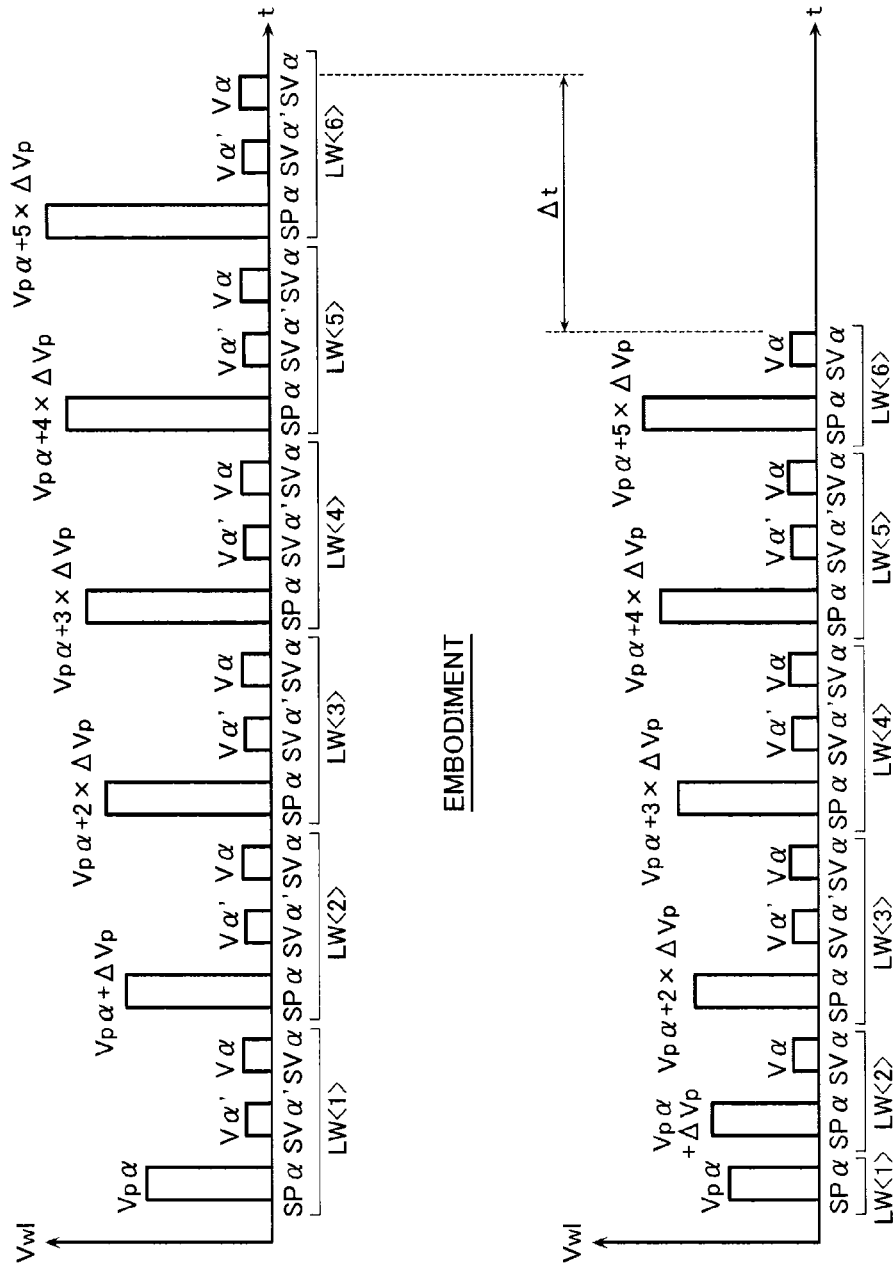
FIG. 18 is a view illustrating an effect of a write sequence of a nonvolatile semiconductor storage device according to a third embodiment.

FIG. 18 is a view illustrating an effect of the write sequence of the nonvolatile semiconductor storage device of the third embodiment. In FIG. 18, similarly to FIG. 14, each write loop LW is expressed by the voltage Vwl applied to the word line WL for the purpose of easy understanding of the write loop LW.

In the specific example of FIG. 18, the write sequence is completed by six write loops LW<1> to LW<6>, the number of write loops of 2 or less is set to the first preverify step omitting condition, the number of write loops of 6 or more is set to the second preverify step omitting condition, and the number of write loops of 1 or less is set to the real verify step omitting condition.

In FIG. 18, because the preverify steps SVα' of the first, second, and sixth write loops LW<1>, LW<2>, and LW<6> and the real verify step SVα of the first write loop LW<1> are omitted, the write sequence processing time can be shortened by a time Δt, for which the verify steps SVα' and SVα are processed four times, compared with the comparative example.

The case that the write sequence of FIG. 18 is applied to a nonvolatile semiconductor storage device in which the memory cell MC having 2 bits/cell is used will be described below with reference to FIGS. 19 and 20.

FIG. 19 is a view illustrating the execution/omission of the preverify step and the real verify step in each write loop of the write sequence in the case that the write sequence of the third embodiment is applied to the nonvolatile semiconductor storage device in which the memory cell MC having 2 bits/cell is used. FIG. 20 is a view illustrating an effect of the write sequence of FIG. 19. Because the comparative example with respect to the specific example of FIG. 19 is identical to that of the left side of FIG. 10, the comparative example is omitted. In the example of FIGS. 19 and 20, after the L page write, the programs at the A level, the B level and the C level are collectively performed through the program step SP in the U page write. Accordingly, the program step SP is performed only once in the program operation. Alternatively, L page write is not performed, but the programs at the A level, the B level and the C level may collectively be performed through the program step SP only in the U page write.

Figure 20:
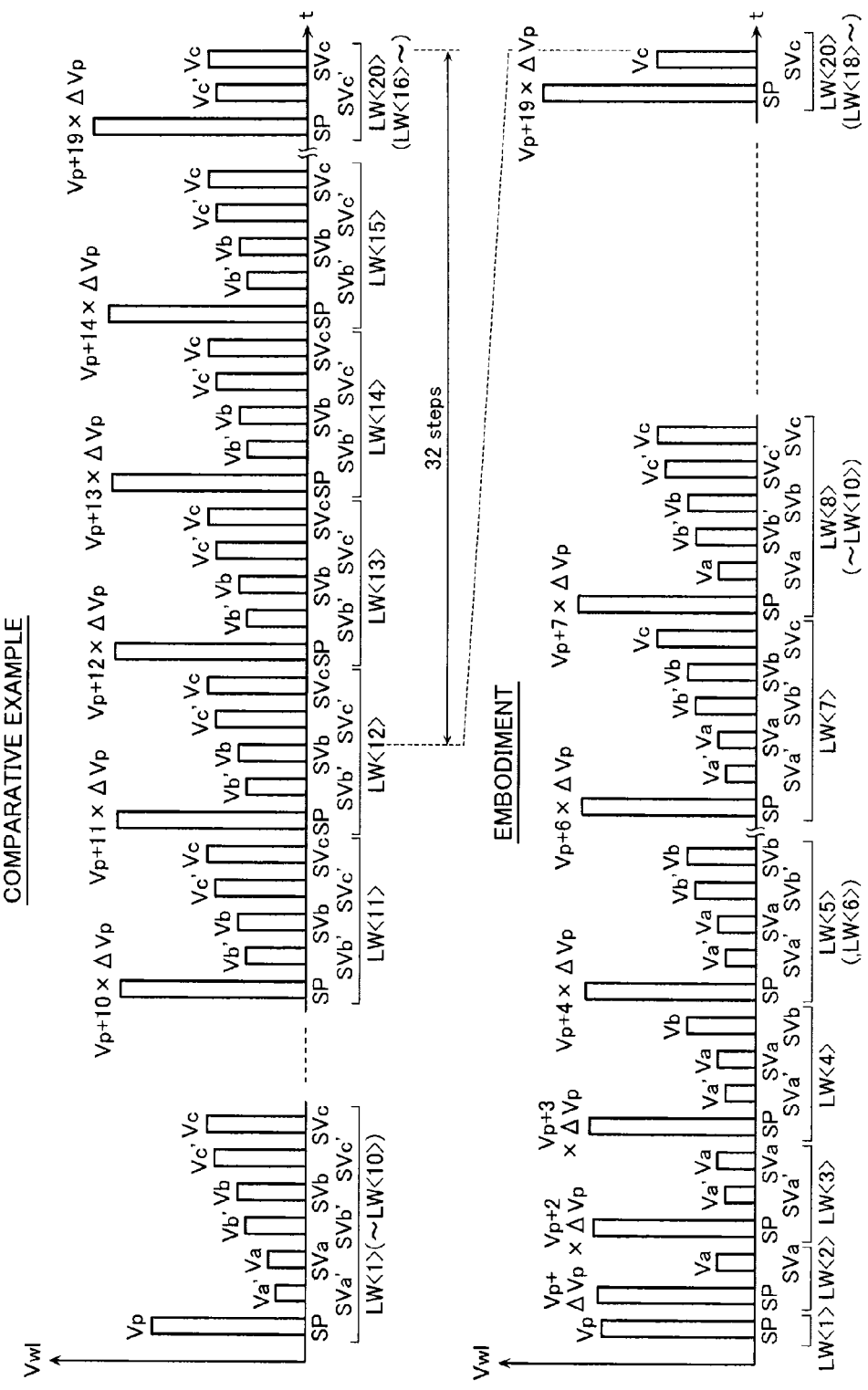
FIG. 20 is a view illustrating an effect of the write sequence of the nonvolatile semiconductor storage device of the third embodiment.

In the specific example of FIGS. 19 and 20, the real verify step omitting conditions at the A level, the B level, and the C level are set to the number of write loops of 1 or less, the number of write loops of 3 or less, and the number of write loops of 6 or less, respectively. Other conditions such as the first preverify step eliminating condition and the second preverify step eliminating condition are identical to those of the specific example in the FIG. 15 and the lower side of FIG. 16.

In this case, as illustrated in FIG. 19 and the lower side of FIG. 20, the preverify steps SVa', SVb', and SVc' and the real verify steps SVa, SVb, and SVc performed to the A level, the B level, and the C level are omitted in the first write loop LW<1>. Therefore, the total of pieces of processing of 1 step is performed in the first write loop LW<1>.

The real verify step SVa is performed to the A level from the second write loop LW<2>. Therefore, the total of pieces of processing of 2 steps is performed in the second write loop LW<2>.

The preverify step SVa' is performed to the A level from the third write loop LW<3>. Therefore, the total of pieces of processing of 3 steps is performed in the third write loop LW<3>.

The real verify step SVb is performed to the B level from the fourth write loop LW<4>. Therefore, the total of pieces of processing of 4 steps is performed in the fourth write loop LW<4>.

The preverify step SVb' is performed to the B level from the fifth write loop LW<5>. Therefore, the total of pieces of processing of 5 steps is performed in the fifth write loop LW<5>. The subsequent sixth write loop LW<6> is identical to the fifth write loop LW<5>.

The real verify step SVc is performed to the C level from the seventh write loop LW<7>. Therefore, the total of pieces of processing of 6 steps is performed in the seventh write loop LW<7>.

Because the subsequent eighth to twentieth write loops LW<8> to LW<20> are identical to those of the specific example of FIGS. 10 and 11, the descriptions of the eighth to twentieth write loops LW<8> to LW<20> are omitted.

Therefore, in the third embodiment, the write loops LW<1> to LW<20> can be processed through the total of 78 steps.

As described above, in the comparative example, the write loops LW<1> to LW<20> are processed through the total of 110 steps.

In the third embodiment, as illustrated in FIG. 20, the write sequence processing time can be shortened by 32 steps compared with the comparative example. Even in this case, the useless preverify step SVa' is omitted similarly to the second embodiment, and only the real verify step SVa in the write loop is omitted at the early state at which the threshold voltage Vth of the memory cell MC does not reach the real verify voltage Va. Therefore, the broadening of the threshold voltage distribution of the memory cell group can be suppressed to the same degree as the comparative example.

In the specific example of FIGS. 19 and 20, the real verify step omitting condition is lower than the second preverify step omitting condition in the number of write loops that become a reference. On the other hand, in the next specific example, the real verify step omitting condition is more than the second preverify step omitting condition in the number of write loops that become the reference.

FIG. 21 is a view illustrating the execution/omission of the preverify step and the real verify step in each write loop of the write sequence in the case that the write sequence of the third embodiment is applied to the nonvolatile semiconductor storage device in which the memory cell MC having 2 bits/cell is used. Because the comparative example with respect to the specific example of FIG. 21 is identical to that of the left side of FIG. 10, the comparative example is omitted.

The specific example of FIG. 21 is identical to that of FIGS. 19 and 20 except that the real verify step omitting conditions at the A level, the B level, and the C level are set to the number of write loops of 3 or less, the number of write loops of 5 or less, and the number of write loops of 7 or less, respectively.

In this case, as illustrated in FIG. 21, because the preverify steps SVa', SVb', and SVc' and the real verify steps SVa, SVb, and SVc performed to the A level, the B level, and the C level are omitted in the first write loop LW<1>, the total of pieces of processing of 1 step is performed in the first write loop LW<1>. The subsequent second write loop LW<2> is identical to the first write loop LW<1>.

The preverify step SVa' is performed to the A level from the third write loop LW<3>. Therefore, the total of pieces of processing of 2 steps is performed in the third write loop LW<3>.

The real verify step SVa is performed to the A level from the fourth write loop LW<4>. Therefore, the total of pieces of processing of 3 steps is performed in the fourth write loop LW<4>.

The preverify step SVb' is performed to the B level from the fifth write loop LW<5>. Therefore, the total of pieces of processing of 4 steps is performed in the fifth write loop LW<5>.

The real verify step SVb is performed to the B level from the sixth write loop LW<6>. Therefore, the total of pieces of processing of 5 steps is performed in the sixth write loop LW<6>. The subsequent seventh write loop LW<7> is identical to the sixth write loop LW<6>.

From the eighth write loop LW<8>, the preverify step SVa' performed to the A level is omitted while the preverify step SVc' is performed to the C level. Therefore, the total of pieces of processing of 5 steps is performed in the eighth write loop LW<8>.

Because the subsequent ninth to twentieth write loops LW<9> to LW<20> are identical to those of the specific example of FIG. 10, the descriptions of the ninth to twentieth write loops LW<9> to LW<20> are omitted.

Therefore, in the third embodiment, the write loops LW<1> to LW<20> can be processed through the total of 72 steps.

As described above, in the comparative example, the write loops LW<1> to LW<20> are processed through the total of 110 steps.

In the third embodiment, the write sequence processing time can be shortened by 38 steps compared with the comparative example. Even in this case, similarly to the specific example of FIGS. 19 and 20, the broadening of the threshold voltage distribution of the memory cell group can be suppressed to the same degree as the comparative example.

As described above, according to the third embodiment, the write sequence processing time can further be shortened compared with the second embodiment while the effect of the write sequence of the QPW method is maintained.

Fourth Embodiment

A fourth embodiment is exemplary application of the first to third embodiments. In the fourth embodiment, a method for applying plural program voltages suitable for the programs at the levels is adopted in the program operation.

The program operation of the write sequence of the fourth embodiment includes a program step SPab at which a program voltage Vpab is applied to perform the programs at the A level and the B level and a program step SPc at which a program voltage Vpc is applied to perform the program at the C level. That is, in the program at the highest C level, it is not necessary to pay much attention to the upper limit of the threshold voltage distribution. On the other hand, in the programs at the A level and the B level, the upper limit of the threshold voltage distribution be adjusted so as not to interfere with another threshold voltage distribution. As a result, the threshold voltage distribution at the C level can be programmed at high speed, and the threshold voltage distributions at the A level and the B level can correctly be programmed.

When the program step SPab at the A level and the B level and the program step SPc at the C level are separated, sometimes the program at the C level is completed prior to the program at the B level.

Therefore, in the fourth embodiment, the first to third embodiments are applied when the program at the C level is completed prior to the program at the B level.

Figure 23:
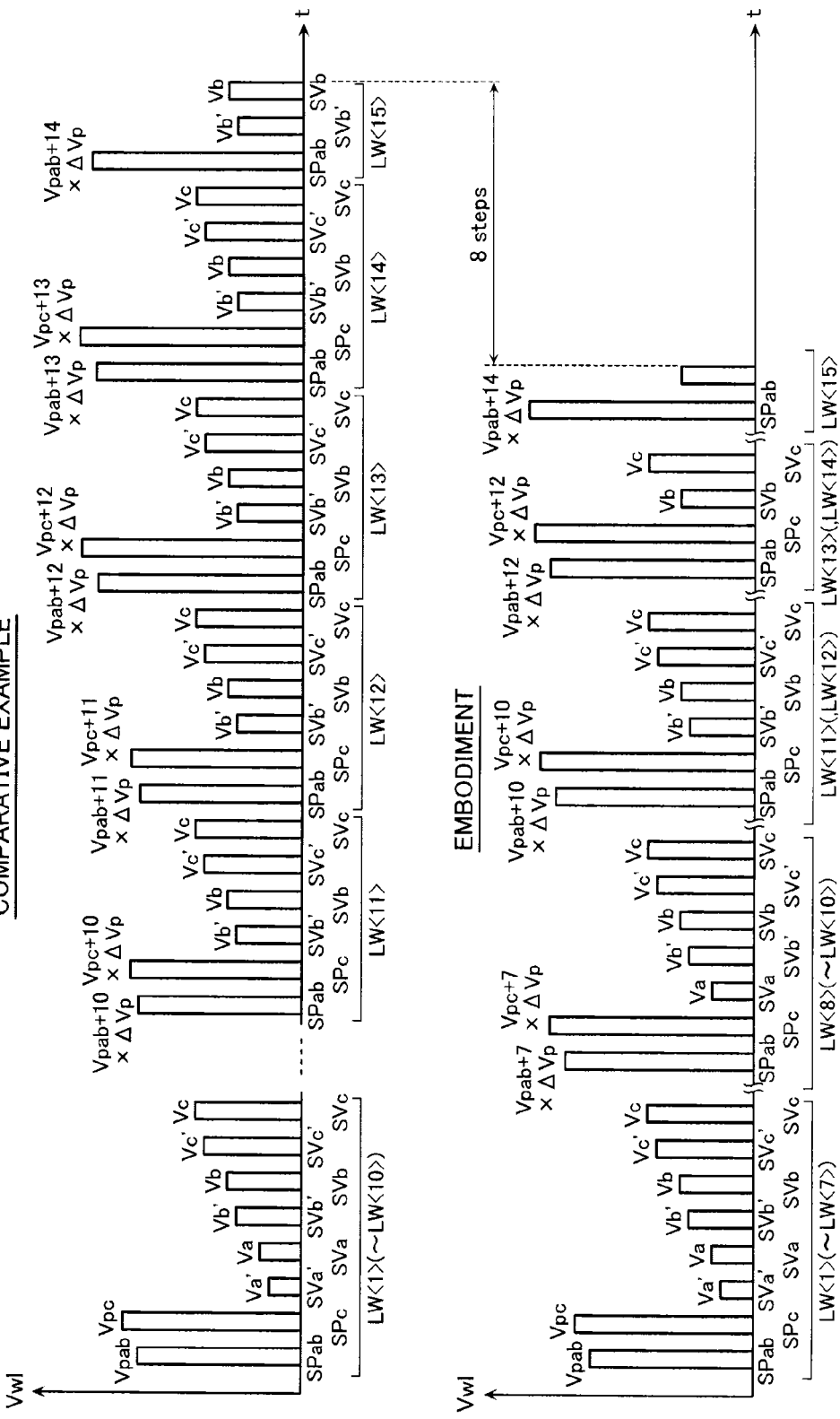
FIG. 23 is a view illustrating an effect of the write sequence of the nonvolatile semiconductor storage device of the fourth embodiment.

An application example of the first embodiment will be described with reference to FIGS. 22 and 23. In the example of FIGS. 22 and 23, after the L page write, the programs at the A level, the B level and the C level are collectively performed through the program step SP in the U page write. Alternatively, L page write is not performed, but the programs at the A level, the B level and the C level may collectively be performed through the program step SP only in the U page write.

FIG. 22 is a view illustrating the execution/omission of the preverify step and the real verify step in each write loop of the write sequence, and FIG. 23 is a view illustrating an effect of the write sequence of FIG. 22.

In the specific example of FIGS. 22 and 23, the numbers of write loops performed for the programs at the A level, the B level, and the C level are set to 10 times, 15 times, and 14 times, respectively. The first preverify step omitting conditions at the A level, the B level, and the C level are set to the numbers of write loops of 8 times or more, 13 times or more, and 13 times or more, respectively.

In this case, as illustrated on the right side of FIG. 22 and the lower side of FIG. 23, the total of pieces of processing of 8 steps including the program steps SPab at the A level and the B level, the program step SPc at the C level, the preverify step SVa' and the real verify step SVa performed to the A level, the preverify step SVb' and the real verify step SVb performed to the B level, and the preverify step SVc' and the real verify step SVc performed to the C level is performed in the first write loop LW<1>. The subsequent second to seventh write loops LW<2> to LW<7> are identical to the first write loop LW<1>.

The preverify step SVa' performed to the A level is omitted from the eighth write loop LW<8>. Therefore, the total of pieces of processing of 7 steps is performed in the eighth write loop LW<8>. The subsequent ninth and tenth write loops LW<9> and LW<10> are identical to the eighth write loop LW<8>.

Therefore, the program at the A level is completed to the memory cell MC. Accordingly, the program operation and the verify operation are omitted for the A level from the subsequent write loop LW.

The total of pieces of processing of 6 steps is performed in the eleventh write loop LW<11>. The subsequent twelfth write loop LW<12> is identical to the eleventh write loop LW<11>.

The preverify steps SVb' and SVc' performed to the B level and the C level are omitted from the thirteenth write loop LW<13>. Therefore, the total of pieces of processing of 4 steps is performed in the thirteenth write loop LW<13>. The subsequent fourteenth write loop LW<14> is identical to the thirteenth write loop LW<13>.

Therefore, the program at the C level is completed to the memory cell MC. Accordingly, the program operation and the verify operation are omitted for the C level from the subsequent write loop LW.

The total of pieces of processing of 2 steps is performed in the final fifteenth write loop LW<15>.

In the specific example illustrated on the right side of FIG. 22 and the lower side of FIG. 23, the write loops LW<1> to LW<15> can be processed through the total of 99 steps.

On the other hand, in the comparative example, as illustrated on the left side of FIG. 22 and the upper side of FIG. 23, the total of pieces of processing of 8 steps is performed in each of the first write loop LW<1> to the tenth write loop LW<10> in which the program at the A level is completed to the memory cell MC. The total of pieces of processing of 6 steps is performed in each of the eleventh write loop LW<11> to the fourteenth write loop LW<14> in which the program at the C level is completed to the memory cell MC. The total of pieces of processing of 3 steps is performed in the fifteenth write loop LW<15> in which the program at the B level is completed to the memory cell MC.

As described above, in the comparative example, the write loops LW<1> to LW<15> are processed through the total of 107 steps.

In the specific example illustrated on the right side of FIG. 22 and the lower side of FIG. 23, the write sequence processing time can be shortened by 8 steps compared with the comparative example as shown in FIG. 23. Even in this case, similarly to the first embodiment, the broadening of the threshold voltage distribution of the memory cell group can be suppressed to the same degree as the comparative example. The threshold voltage distribution at the C level can be programmed at high speed, and the threshold voltage distributions at the A level and the B level can correctly be programmed.

An application example of the second embodiment will be described below with reference to FIG. 24.

FIG. 24 is a view illustrating the execution/omission of the preverify step and the real verify step in each write loop of the write sequence. Because the comparative example with respect to the specific example of FIG. 24 is identical to that of the left side of FIG. 22, the comparative example is omitted.

In the specific example of FIG. 24, the second preverify step omitting conditions at the A level, the B level, and the C level are set to the number of write loops of 2 or less, the number of write loops of 4 or less, and the number of write loops of 4 or less, respectively. Other conditions such as the first preverify step eliminating condition are identical to those of the specific example illustrated on the right side of FIG. 22 and the lower side of FIG. 23.

In this case, as illustrated in FIG. 24, the preverify steps SVa', SVb', and SVc' performed to the A level, the B level, and the C level are omitted in the first write loop LW<1>. Therefore, the total of pieces of processing of 5 steps is performed in the first write loop LW<1>. The subsequent second write loop LW<2> is identical to the first write loop LW<1>.

The preverify step SVa' is performed to the A level from the third write loop LW<3>. Therefore, the total of pieces of processing of 6 steps is performed in the third write loop LW<3>. The subsequent fourth write loop LW<4> is identical to the third write loop LW<3>.

The preverify steps SVb' and SVc' are performed to the B level and the C level from the fifth write loop LW<5>. Therefore, the total of pieces of processing of 8 steps is performed in the fifth write loop LW<5>.

Because the subsequent eighth to fifteenth write loops LW<8> to LW<15> are identical to those of the specific example of FIGS. 22 and 23, the descriptions of the eighth to fifteenth write loops LW<8> to LW<15> are omitted.

In the specific example of FIG. 24, the write loops LW<1> to LW<15> can be processed through the total of 89 steps.

As described above, in the comparative example, the write loops LW<1> to LW<15> are processed through the total of 107 steps.

In the specific example illustrated in FIG. 24, the write sequence processing time can be shortened by 18 steps compared with the comparative example. Even in this case, similarly to the second embodiment, the broadening of the threshold voltage distribution of the memory cell group can be suppressed to the same degree as the comparative example. The threshold voltage distribution at the C level can be programmed at high speed, and the threshold voltage distributions at the A level and the B level can correctly be programmed.

An application example of the third embodiment will be described below with reference to FIG. 25.

FIG. 25 is a view illustrating the execution/omission of the preverify step and the real verify step in each write loop of the write sequence. Because the comparative example with respect to the specific example of FIG. 25 is identical to that of the left side of FIG. 22, the comparative example is omitted.

In the specific example of FIG. 25, the real verify step omitting conditions at the A level, the B level, and the C level are set to the number of write loops of 1 or less, the number of write loops of 3 or less, and the number of write loops of 3 or less, respectively. Other conditions such as the first preverify step eliminating condition and the second preverify step eliminating condition are identical to those of the specific example illustrated on the right side of FIG. 22 and the lower side of FIG. 23.

In this case, as illustrated in FIG. 25, the preverify steps SVa', SVb', and SVc' and the real verify steps SVa, SVb, and SVc performed to the A level, the B level, and the C level are omitted in the first write loop LW<1>. Therefore, the total of pieces of processing of 2 steps is performed in the first write loop LW<1>.

The preverify step SVa' is performed to the A level from the second write loop LW<2>. Therefore, the total of pieces of processing of 3 steps is performed in the third write loop LW<2>.

The real verify step SVa is performed to the A level from the third write loop LW<3>. Therefore, the total of pieces of processing of 4 steps is performed in the third write loop LW<3>.

The real verify steps SVb and SVc are performed to the B level and the C level from the fourth write loop LW<4>. Therefore, the total of pieces of processing of 6 steps is performed in the fourth write loop LW<4>.

Because the subsequent fifth to fifteenth write loops LW<5> to LW<15> are identical to those of the specific example of FIGS. 22 and 23, the descriptions of the fifth to fifteenth write loops LW<5> to LW<15> are omitted.

In the specific example of FIG. 25, the write loops LW<1> to LW<15> can be processed through the total of 82 steps.

As described above, in the comparative example, the write loops LW<1> to LW<15> are processed through the total of 107 steps.

In the specific example illustrated in FIG. 25, the write sequence processing time can be shortened by 25 steps compared with the comparative example. Even in this case, similarly to the third embodiment, the broadening of the threshold voltage distribution of the memory cell group can be suppressed to the same degree as the comparative example. The threshold voltage distribution at the C level can be programmed at high speed, and the threshold voltage distributions at the A level and the B level can correctly be programmed.

As described above, according to the fourth embodiment, the same effects as the first to third embodiments can be obtained in the nonvolatile semiconductor storage device in which the method for applying the plural program voltages suitable for the programs at the levels is adopted in the program operation. The threshold voltage distribution at the C level can be programmed at high speed, and the threshold voltage distributions at the A level and the B level can correctly be programmed.

Fifth Embodiment

A fifth embodiment is exemplary application of the first to third embodiments. In the fifth embodiment, similarly to the fourth embodiment, the method for applying the plural program voltages suitable for the programs at the levels is adopted in the program operation.

However, the program operation of the write sequence of the fifth embodiment differs from that of the fourth embodiment in that the program operation of the write sequence of the fifth embodiment includes a program step SPa at which a program voltage Vpa is applied to perform the program at the A level and a program step SPbc at which a program voltage Vpbc is applied to perform the programs at the B level and the C level. The program at the A level and the programs at the B level and the C level are separated, whereby a write speed at which the data is written in the memory cells MC at the B level and the C level is enhanced while a probability of increasing the threshold voltage of the memory cell MC in which the data is written at the A level is reduced.

When the program step SPa at the A level and the program steps SPbc at the B level and the C level are separated, sometimes the program at the B level is completed prior to the program at the A level.

Therefore, in the fifth embodiment, the first to third embodiments are applied when the program at the B level is completed prior to the program at the A level.

Figure 27:
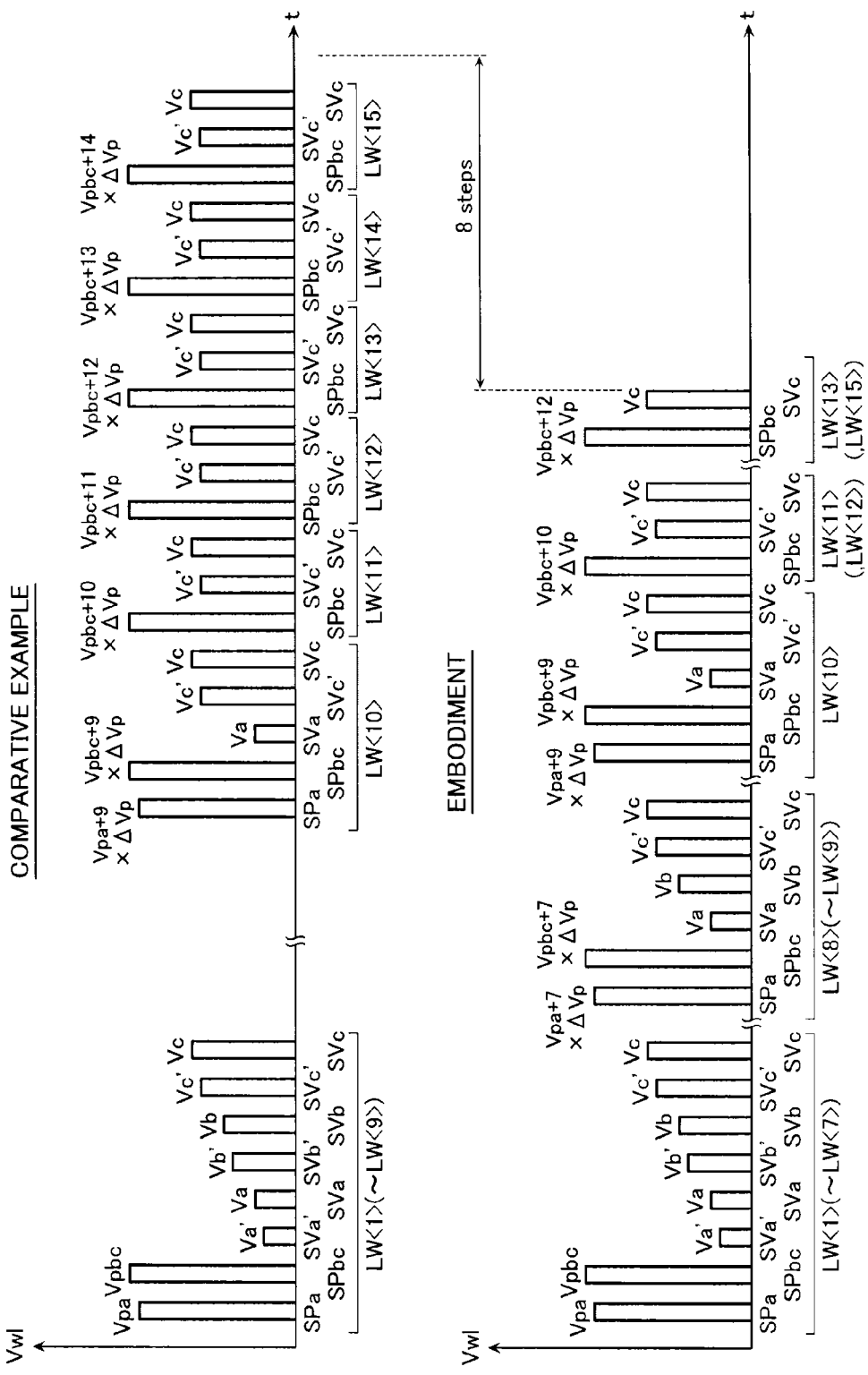
FIG. 27 is a view illustrating an effect of the write sequence of the nonvolatile semiconductor storage device of the fifth embodiment.

An application example of the first embodiment will be described with reference to FIGS. 26 and 27. In the example of FIGS. 26 and 27, after the L page write, the programs at the A level, the B level and the C level are collectively performed through a program step SP in the U page write. Alternatively, L page write is not performed, but the programs at the A level, the B level and the C level may collectively be performed through the program step SP only in the U page write.

FIG. 26 is a view illustrating the execution/omission of the preverify step and the real verify step in each write loop of the write sequence, and FIG. 27 is a view illustrating an effect of the write sequence of FIG. 26.

In the specific example illustrated on the right side of FIG. 26 and the lower side of FIG. 27, the numbers of write loops performed for the programs at the A level, the B level, and the C level are set to 10 times, 9 times, and 15 times, respectively. The first preverify step omitting conditions at the A level, the B level, and the C level are set to the numbers of write loops of 8 times or more, 8 times or more, and 13 times or more, respectively.

In this case, as illustrated on the right side of FIG. 26 and the lower side of FIG. 27, the total of pieces of processing of 8 steps including the program step SPa at the A level, the program steps SPbc at the B level and the C level, the preverify step SVa' and the real verify step SVa performed to the A level, the preverify step SVb' and the real verify step SVb performed to the B level, and the preverify step SVc' and the real verify step SVc performed to the C level is performed in the first write loop LW<1>. The subsequent second to seventh write loops LW<2> to LW<7> are identical to the first write loop LW<1>.

The preverify steps SVa' and SVb' performed to the A level and the B level are omitted from the eighth write loop LW<8>. Therefore, the total of pieces of processing of 6 steps is performed in the eighth write loop LW<8>. The subsequent ninth write loop LW<9> is identical to the eighth write loop LW<8>.

Therefore, the program at the B level is completed to the memory cell MC. Accordingly, the program operation and the verify operation are omitted for the B level from the subsequent write loop LW.

The total of pieces of processing of 5 steps is performed in the tenth write loop LW<10>.

Therefore, the program at the A level is completed to the memory cell MC. Accordingly, the program operation and the verify operation are omitted for the A level from the subsequent write loop LW.

The total of pieces of processing of 3 steps is performed in the eleventh write loop LW<11>. The subsequent twelfth write loop LW<12> is identical to the eleventh write loop LW<11>.

The preverify step SVc' performed to the C level is omitted from the thirteenth write loop LW<13>. Therefore, the total of pieces of processing of 2 steps is performed in the thirteenth write loop LW<13>. The subsequent fourteenth write loop LW<14> and the final fifteenth write loop LW<15> are identical to the thirteenth write loop LW<13>. In the specific example of FIGS. 26 and 27, the threshold voltage distributions at the B level and the C level can be programmed at high speed while the threshold voltage distribution at the A level is correctly programmed.

In the specific example illustrated on the right side of FIG. 26 and the lower side of FIG. 27, the write loops LW<1> to LW<15> can be processed through the total of 85 steps.

On the other hand, in the comparative example, as illustrated on the left side of FIG. 26 and the upper side of FIG. 27, the total of pieces of processing of 8 steps is performed in each of the first write loop LW<1> to the ninth write loop LW<9> in which the program at the B level is completed to the memory cell MC. The total of pieces of processing of 6 steps is performed in the tenth write loop LW<10> in which the program at the A level is completed to the memory cell MC. The total of pieces of processing of 3 steps is performed in each of the eleventh write loop LW<11> to the fifteenth write loop LW<15> in which the program at the C level is completed to the memory cell MC.

As described above, in the comparative example, the write loops LW<1> to LW<15> are processed through the total of 93 steps.

In the specific example illustrated on the right side of FIG. 26 and the lower side of FIG. 27, the write sequence processing time can be shortened by 8 steps compared with the comparative example as shown in FIG. 27. Even in this case, similarly to the first embodiment, the broadening of the threshold voltage distribution of the memory cell group can be suppressed to the same degree as the comparative example.

An application example of the second embodiment will be described below with reference to FIG. 28.

FIG. 28 is a view illustrating the execution/omission of the preverify step and the real verify step in each write loop of the write sequence. Because the comparative example with respect to the specific example of FIG. 28 is identical to that of the left side of FIG. 26, the comparative example is omitted.

In the specific example of FIG. 28, the second preverify step omitting conditions at the A level, the B level, and the C level are set to the number of write loops of 2 or less, the number of write loops of 4 or less, and the number of write loops of 4 or less, respectively. Other conditions such as the first preverify step eliminating condition are identical to those of the specific example illustrated on the right side of FIG. 26 and the lower side of FIG. 27.

In this case, as illustrated in FIG. 27, the preverify steps SVa', SVb', and SVc' performed to the A level, the B level, and the C level are omitted in the first write loop LW<1>. Therefore, the total of pieces of processing of 5 steps is performed in the first write loop LW<1>. The subsequent second write loop LW<2> is identical to the first write loop LW<1>.

The preverify step SVa' is performed to the A level from the third write loop LW<3>. Therefore, the total of pieces of processing of 6 steps is performed in the third write loop LW<3>. The subsequent fourth write loop LW<4> is identical to the third write loop LW<3>.

Because the subsequent fifth to fifteenth write loops LW<5> to LW<15> are identical to those of the specific example of FIGS. 26 and 27, the descriptions of the fifth to fifteenth write loops LW<5> to LW<15> are omitted.

In the specific example of FIG. 28, the write loops LW<1> to LW<15> can be processed through the total of 75 steps.

As described above, in the comparative example, the write loops LW<1> to LW<15> are processed through the total of 93 steps.

In the specific example illustrated in FIG. 28, the write sequence processing time can be shortened by 18 steps compared with the comparative example. Even in this case, similarly to the second embodiment, the broadening of the threshold voltage distribution of the memory cell group can be suppressed to the same degree as the comparative example. In the specific example of FIG. 28, the threshold voltage distributions at the B level and the C level can be programmed at high speed while the threshold voltage distribution at the A level is correctly programmed.

An application example of the third embodiment will be described below with reference to FIG. 29.

FIG. 29 is a view illustrating the execution/omission of the preverify step and the real verify step in each write loop of the write sequence. Because the comparative example with respect to the specific example of FIG. 29 is identical to that of the left side of FIG. 26, the comparative example is omitted.

In the specific example of FIG. 29, the real verify step omitting conditions at the A level, the B level, and the C level are set to the number of write loops of 1 or less, the number of write loops of 3 or less, and the number of write loops of 3 or less, respectively. Other conditions such as the first preverify step eliminating condition and the second preverify step eliminating condition are identical to those of the specific example illustrated on the right side of FIG. 26 and the lower side of FIG. 27.

In this case, as illustrated in FIG. 29, the preverify steps SVa', SVb', and SVc' and the real verify steps SVa, SVb, and SVc performed to the A level, the B level, and the C level are omitted in the first write loop LW<1>. Therefore, the total of pieces of processing of 2 steps is performed in the first write loop LW<1>.

The preverify step SVa' is performed to the A level from the second write loop LW<2>. Therefore, the total of pieces of processing of 3 steps is performed in the third write loop LW<2>.

The real verify step SVa is performed to the A level from the third write loop LW<3>. Therefore, the total of pieces of processing of 4 steps is performed in the third write loop LW<3>.

The real verify steps SVb and SVc are performed to the B level and the C level from the fourth write loop LW<4>. Therefore, the total of pieces of processing of 6 steps is performed in the fourth write loop LW<4>.

Because the subsequent fifth to fifteenth write loops LW<5> to LW<15> are identical to those of the specific example of FIGS. 26 and 27, the descriptions of the fifth to fifteenth write loops LW<5> to LW<15> are omitted.

In the specific example of FIG. 29, the write loops LW<1> to LW<15> can be processed through the total of 68 steps.

As described above, in the comparative example, the write loops LW<1> to LW<15> are processed through the total of 93 steps.

In the specific example illustrated in FIG. 29, the write sequence processing time can be shortened by 25 steps compared with the comparative example. Even in this case, similarly to the third embodiment, the broadening of the threshold voltage distribution of the memory cell group can be suppressed to the same degree as the comparative example. In the specific example of FIG. 29, the threshold voltage distributions at the B level and the C level can be programmed at high speed while the threshold voltage distribution at the A level is correctly programmed.

As described above, according to the fifth embodiment, the same effects as the first to third embodiments can be obtained in the nonvolatile semiconductor storage device in which the method for applying the plural program voltages suitable for the programs at the levels is adopted in the program operation. In the fifth embodiment, the threshold voltage distributions at the B level and the C level can be programmed at high speed while the threshold voltage distribution at the A level is correctly programmed.

Sixth Embodiment

In the first to fifth embodiments, the first preverify step eliminating condition is set based on the number of write loops.

On the other hand, in a sixth embodiment, the first preverify step eliminating condition is set based on the number of memory cells in each of which the threshold voltage is equal to or lower than the preverify voltage.

When the write loop is repeatedly performed to the memory cell MC, the threshold voltage Vth of the memory cell MC transitions to a positive direction as illustrated by an arrow al of FIG. 30. As can be seen from FIG. 30, the threshold voltage distribution of the memory cell group moves in the positive direction so as to draw the lower foot, and the lower foot of the threshold voltage distribution of the memory cell group moves largely in the positive direction from the preverify voltage Vα' to narrow the threshold voltage distribution of the memory cell group. That is, it pays attention to the number of memory cells located in the lower foot of the threshold voltage distribution. Therefore, in the sixth embodiment, the preverify step of the write loop is omitted on the condition that the number of memory cells (memory cell MC illustrated by hatched lines in FIG. 30) in each of which the threshold voltage Vth becomes equal to or lower than the preverify voltage Vα'.

Figure 31:
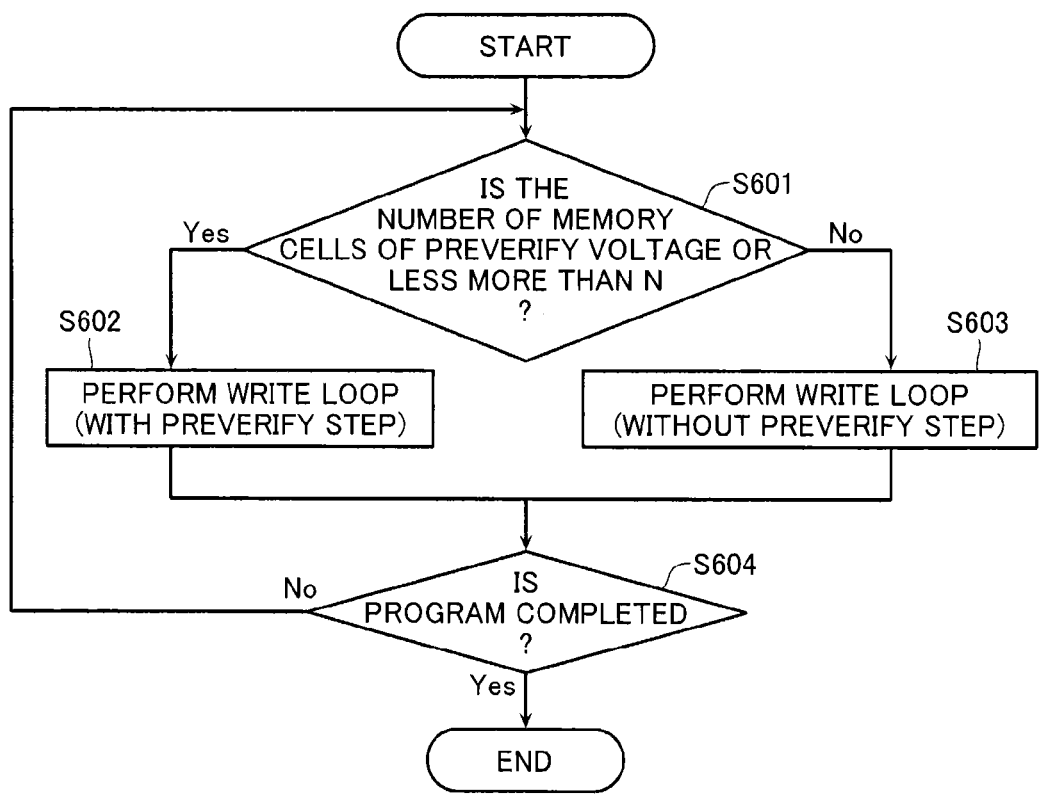
FIG. 31 is a flowchart illustrating a write sequence of the nonvolatile semiconductor storage device of the sixth embodiment.

FIG. 31 is a flowchart illustrating a write sequence of the nonvolatile semiconductor storage device of the sixth embodiment.

In the write sequence of the sixth embodiment, the sequence control 7 determines whether the number of memory cells in each of which the threshold voltage Vth is equal to or lower than the preverify voltage Vα' is more than a predetermined number N (for example, 100) (Step S601 of FIG. 31). When the number of memory cells MC is more than the predetermined number N, the sequence control 7 performs the write loop including the preverify step (Step S602 of FIG. 31). When the number of write loops is equal to or lower than the set number N, the sequence control 7 performs the write loop in which the preverify step is omitted (Step S603 of FIG. 31). The sequence control 7 repeatedly performs the pieces of processing in Steps S601 to S603 until the program is completed to the memory cell (Step S604 of FIG. 31). For example, the set number N may previously be recorded in the ROM fuse region 1a. The set number N and the write command may simultaneously be sent from the controller 11 to the NAND chip 10.

According to the sixth embodiment, the first preverify step eliminating condition is set based on the number of memory cells in each of which the threshold voltage is equal to or lower than the preverify voltage in the memory cell group. Therefore, a difference of a program characteristic of the memory cell, which is generated among the nonvolatile semiconductor storage devices, can be compensated to a certain degree.

Accordingly, in a sixth embodiment, the first preverify step eliminating condition of the first to fifth embodiments is set based on the number of memory cells in each of which the threshold voltage is equal to or lower than the preverify voltage, allows the preverify step to be more properly executed/omitted.

Seventh Embodiment

In the first to sixth embodiments, the effect can be obtained even if the first preverify step eliminating condition is fixed. However, not only the variation in program characteristic of the memory cell is generated among the nonvolatile semiconductor storage devices, but also the program characteristic changes according to usage even in the same memory cell. For example, when the number of write/erasing cycles is increased, generally the program speed of the memory cell tends to be enhanced.

Therefore, in the seventh embodiment, the first preverify step eliminating condition is variable so as to be able to deal flexibly with the change in the program characteristic of the memory cell.

Figure 32:
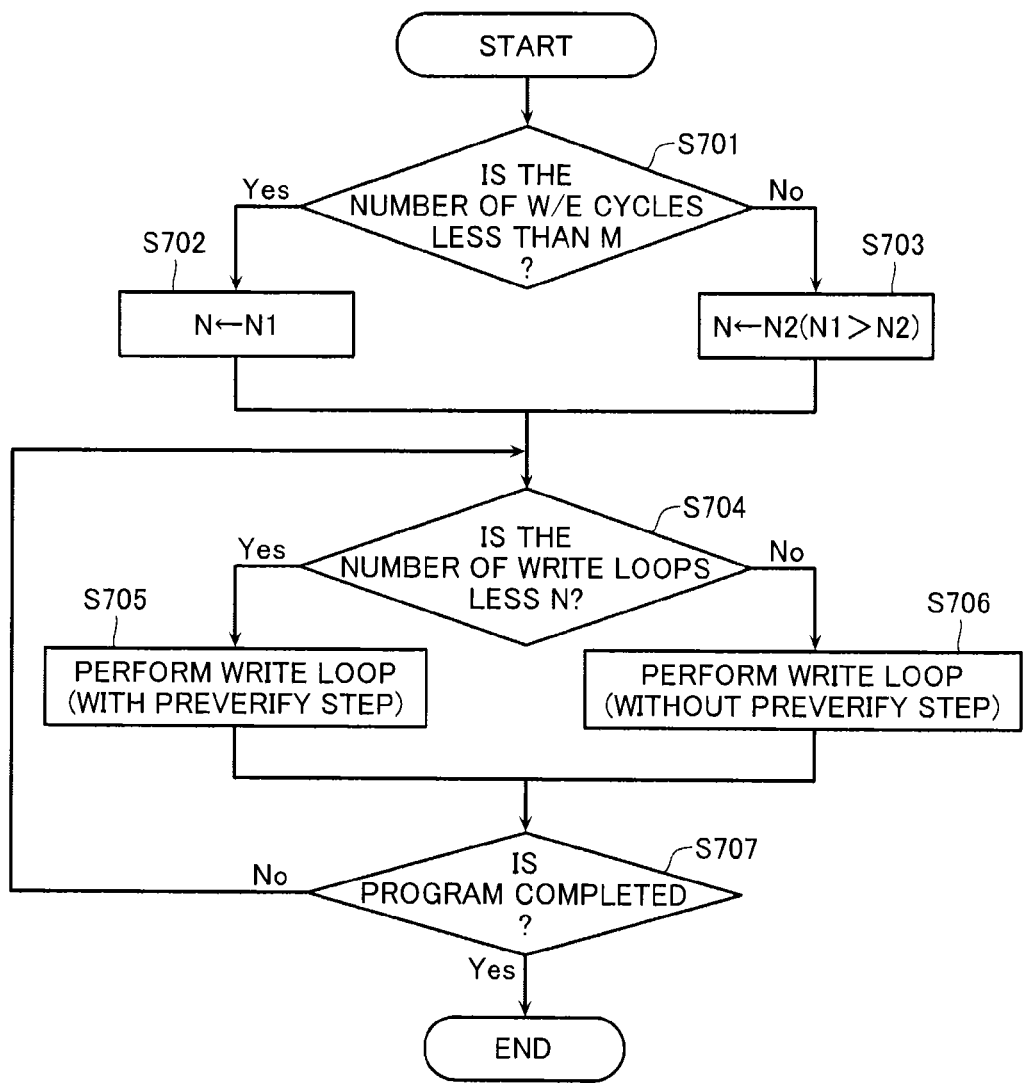
FIG. 32 is a flowchart illustrating a write sequence of a nonvolatile semiconductor storage device according to a seventh embodiment.

FIG. 32 illustrates an exemplary application of the first embodiment, and FIG. 32 is a flowchart illustrating a write sequence when the first preverify step omitting condition of the first embodiment is variable.

Referring to FIG. 32, when the write sequence is started, the sequence control 7 determines whether the number of write cycles is more than a predetermined number M (Step S701 of FIG. 32). When the number of write cycles is lower than the predetermined number M, the sequence control 7 initializes the number of write loops N, which becomes a reference of the first preverify step eliminating condition, to a set number N1 (Step S702 of FIG. 32). On the other hand, when the number of write cycles is equal to or more than the set number M, because it is considered that the program speed of the memory cell MC is enhanced, the sequence control 7 initializes the number of write loops N to a set number N2 lower than the set number N1 (Step S703 of FIG. 32). In Steps S704 to S707, the sequence control 7 performs the same write sequence as the first embodiment using the number of write loops N. For example, the number of write/erasing cycles M, the numbers of write loops N1 and N2, and the like, which constitute above write sequence condition, may previously be recorded in the ROM fuse region 1a. The controller 11 reads the numbers of write loops N1 and N2 and the like from the ROM fuse region 1a, and the controller 11 may simultaneously transmit the number of write loops N and the write command to the NAND chip 10.

Figure 33:
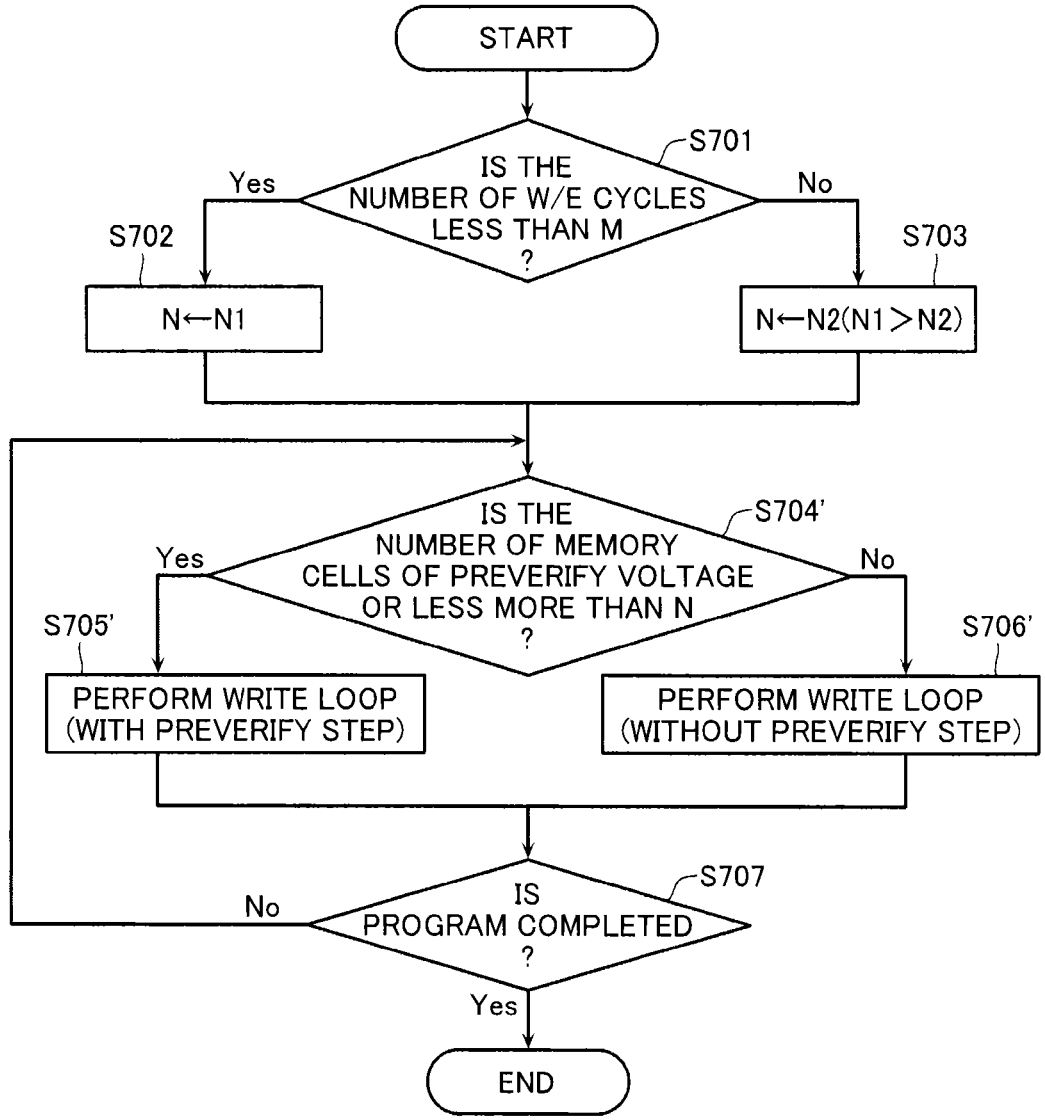
FIG. 33 is a flowchart illustrating a write sequence when the sixth embodiment is applied in the nonvolatile semiconductor storage device of the seventh embodiment.

The seventh embodiment can be applied to the sixth embodiment. FIG. 33 illustrates the case that the seventh embodiment can be applied to the sixth embodiment.

Because Steps S701 to S703 are identical to those of FIG. 32, the descriptions are omitted. Then, the sequence control 7 determines whether the number of memory cells in each of which the threshold voltage Vth is equal to or lower than the preverify voltage Vα' is more than the set number N (for example, 100) (Step S704' of FIG. 33). When the number of memory cells is more than the set number N, the sequence control 7 performs the write loop including the preverify step (Step S705' of FIG. 33). When the number of write loops is equal to or lower than the set number N, the sequence control 7 performs the write loop in which the preverify step is omitted (Step S706' of FIG. 33). The sequence control 7 repeatedly performs the pieces of processing in Steps S704' to S706' until the program is completed to the memory cell (Step S707 of FIG. 33). For example, the number of write/erasing cycles M, the numbers of write loops N1 and N2, and the like, which constitute a write sequence determination condition, may previously be recorded in the ROM fuse region 1a. The controller 11 reads the numbers of write loops N1 and N2 and the like from the ROM fuse region 1a, and the controller 11 may simultaneously transmit the number of write loops N and the write command to the NAND chip 10.

As described above, when the seventh embodiment is applied to the first to sixth embodiments, not only the same effects as the first to sixth embodiments can be obtained, but also the write sequence of the QPW method can more properly be performed according to the change in program characteristic of the memory cell.

[Other]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
a memory cell array including a plurality of memory cells each of which stores data by a plurality of different threshold voltages in a nonvolatile manner; and
a control circuit that repeatedly performs a write loop including a program operation to cause the threshold voltage of the memory cell to transition and a verify operation to check whether the threshold voltage of the memory cell in the program operation transitions to a first value in data write performed to the memory cell,
the verify operation including a preverify step to check whether the threshold voltage of the memory cell transitions to a preverify voltage, which is set to a value lower than that of a real verify voltage indicating a lower limit of a first threshold voltage of the memory cell, and a real verify step to check whether the threshold voltage of the memory cell transitions to the real verify voltage,
the write loop including one or at least two verify operations corresponding to pieces of the data,
the control circuit performing the write loop in which the preverify step of the verify operation corresponding to a first data is omitted after obtaining a first condition.

2. The nonvolatile semiconductor storage device according to claim 1, wherein the first condition is fixed by the number of times of the write loop.

3. The nonvolatile semiconductor storage device according to claim 1, wherein the data write is performed to the plurality of memory cells, and the first condition is fixed by the number of memory cells in each of which the threshold voltage transitions to the preverify voltage in the memory cells to which the data write is performed.

4. The nonvolatile semiconductor storage device according to claim 1, wherein the program operation of the write loop includes one or at least two program steps corresponding to pieces of the data, and the control circuit performs the write loop in which the program step corresponding to the first data is omitted when the number of write loops becomes a first number.

5. The nonvolatile semiconductor storage device according to claim 1, wherein the memory cell array includes a ROM fuse region, and the control circuit determines whether the first condition is obtained based on a value stored in the ROM fuse region.

6. The nonvolatile semiconductor storage device according to claim 1, wherein the control circuit switches the first condition according to the number of write/erasing cycles performed to the memory cell.

7. A nonvolatile semiconductor storage device comprising:
a memory cell array including a plurality of memory cells each of which stores data; and
a control circuit that repeatedly performs a write loop including a program operation and a verify operation,
the verify operation including a preverify step to check whether the threshold voltage of the memory cell transitions to a preverify voltage, which is lower than that of a real verify voltage, and a real verify step to check whether the threshold voltage of the memory cell transitions to the real verify voltage,
the write loop including one or at least two verify operations corresponding to pieces of the data,
the control circuit performing the write loop in which the preverify step of the verify operation corresponding to a first data is omitted after a first condition.

8. The nonvolatile semiconductor storage device according to claim 7, wherein the control circuit skips the preverify step of the verify operation corresponding to the first data since starting of the data write performed to the memory cell until a second condition.

9. The nonvolatile semiconductor storage device according to claim 8, wherein the first condition is fixed by the number of times of the write loop.

10. The nonvolatile semiconductor storage device according to claim 8, wherein the second condition is fixed by the number of times of the write loop.

11. The nonvolatile semiconductor storage device according to claim 8, wherein the data write is performed to the plurality of memory cells, and the first condition is fixed by the number of memory cells in each of which the threshold voltage transitions to the preverify voltage in the memory cells to which the data write is performed.

12. The nonvolatile semiconductor storage device according to claim 8, wherein the program operation of the write loop includes one or at least two program steps corresponding to pieces of the data, and the control circuit performs the write loop in which the program step corresponding to the predetermined data is omitted when the number of write loops becomes a predetermined number.

13. The nonvolatile semiconductor storage device according to claim 8, wherein the control circuit switches the first condition according to the number of write/erasing cycles performed to the memory cell.

14. A nonvolatile semiconductor storage device comprising:
a memory cell array including a plurality of memory cells each of which stores data; and
a control circuit that repeatedly performs a write loop including a program operation and a verify operation,
the verify operation including a preverify step to check whether the threshold voltage of the memory cell transitions to a preverify voltage, which is lower than that of a real verify voltage, and a real verify step to check whether the threshold voltage of the memory cell transitions to the real verify voltage,
the write loop including one or at least two verify operations corresponding to pieces of the data,
the control circuit performing the write loop in which the preverify step of the verify operation corresponding to a first data is skipped after a first condition,
wherein the control circuit skips the real verify step of the verify operation corresponding to the first data since starting of the data write performed to the memory cell until a second condition.

15. The nonvolatile semiconductor storage device according to claim 14, wherein the first condition is fixed by the number of times of the write loop.

16. The nonvolatile semiconductor storage device according to claim 14, wherein the third condition is fixed by the number of times of the write loop.

17. The nonvolatile semiconductor storage device according to claim 14, wherein the data write is performed to the plurality of memory cells, and the first condition is fixed by the number of memory cells in each of which the threshold voltage transitions to the preverify voltage in the memory cells to which the data write is performed.

18. The nonvolatile semiconductor storage device according to claim 14, wherein the program operation of the write loop includes one or at least two program steps corresponding to pieces of the data, and the control circuit performs the write loop in which the program step corresponding to the predetermined data is omitted when the number of write loops becomes a predetermined number.

19. The nonvolatile semiconductor storage device according to claim 14, wherein the control circuit switches the first condition according to the number of write/erasing cycles performed to the memory cell.

* * * * *